(12) United States Patent
Niki

(10) Patent No.: US 7,504,908 B2
(45) Date of Patent: Mar. 17, 2009

(54) ELECTRIC CIRCUIT DEVICE AND SUBSTRATE USED THEREFOR

(75) Inventor: Kazuya Niki, Hirakata (JP)

(73) Assignee: Sanyo Electric Co., Ltd., Osaka (JP)

( * ) Notice: Subject to any disclaimer, the term of this patent is extended or adjusted under 35 U.S.C. 154(b) by 47 days.

(21) Appl. No.: 11/641,901

(22) Filed: Dec. 20, 2006

(65) Prior Publication Data
US 2007/0159272 A1 Jul. 12, 2007

(30) Foreign Application Priority Data
Dec. 26, 2005 (JP) ............................... 2005-372844
Oct. 23, 2006 (JP) ............................... 2006-287298

(51) Int. Cl.
*H03H 7/00* (2006.01)
*H01G 4/228* (2006.01)

(52) U.S. Cl. ...................................... 333/185; 333/246

(58) Field of Classification Search ................. 333/185; 361/301.1, 301.4, 306.1, 306.3, 307, 303
See application file for complete search history.

(56) References Cited

U.S. PATENT DOCUMENTS

| 6,331,930 | B1 * | 12/2001 | Kuroda et al. ............ 361/306.3 |
| 6,331,932 | B1 | 12/2001 | Kobayashi et al. |
| 6,699,809 | B2 | 3/2004 | Fujikawa et al. |
| 6,768,630 | B2 * | 7/2004 | Togashi .................... 361/306.1 |
| 7,019,957 | B2 | 3/2006 | Togashi et al. |
| 2007/0067066 | A1 | 3/2007 | Niki |
| 2007/0146099 | A1 | 6/2007 | Ezaki et al. |

FOREIGN PATENT DOCUMENTS

| JP | 04-056207 A | 2/1992 |
| JP | 2004-80773 A | 3/2004 |
| JP | 2005-032900 A | 2/2005 |
| JP | 2005-191504 A | 7/2005 |

OTHER PUBLICATIONS

International Search Report of PCT/JP2006/323451; date of mailing Feb. 27, 2007 (issued in the corresponding PCT application for co-pending U.S. Appl. No. 12/159,104, filed with USPTO on Jun. 25, 2008).
Co-pending U.S. Appl. No. 12/159,104, filed Jun. 25, 2008.

* cited by examiner

*Primary Examiner*—Dean O Takaoka
(74) *Attorney, Agent, or Firm*—Westerman, Hattori, Daniels & Adrian, LLP.

(57) ABSTRACT

The five conductive plates are formed on the principal surface of the stacked five dielectric layers, respectively. The two side anode electrodes are connected to the two conductive plates, while the two side cathode electrodes are connected to the three conductive plates. The two anode electrodes are connected to the two side anode electrodes, respectively. The one cathode electrode is connected to one of two side cathode electrodes, while the other cathode electrode is connected to the other one of two side cathode electrodes. The two conductive plates pass a current along the opposite direction from the three conductive plates. Where the overlap part between the two conductive plates and three conductive plates, the length in which a current flows is set not less than length of the perpendicular direction to the direction in which the current flows. As a result, the impedance can be reduced due to a reducing inductance.

21 Claims, 30 Drawing Sheets

(a)

(b)

(c)

(d)

(e)

Fig.1.5
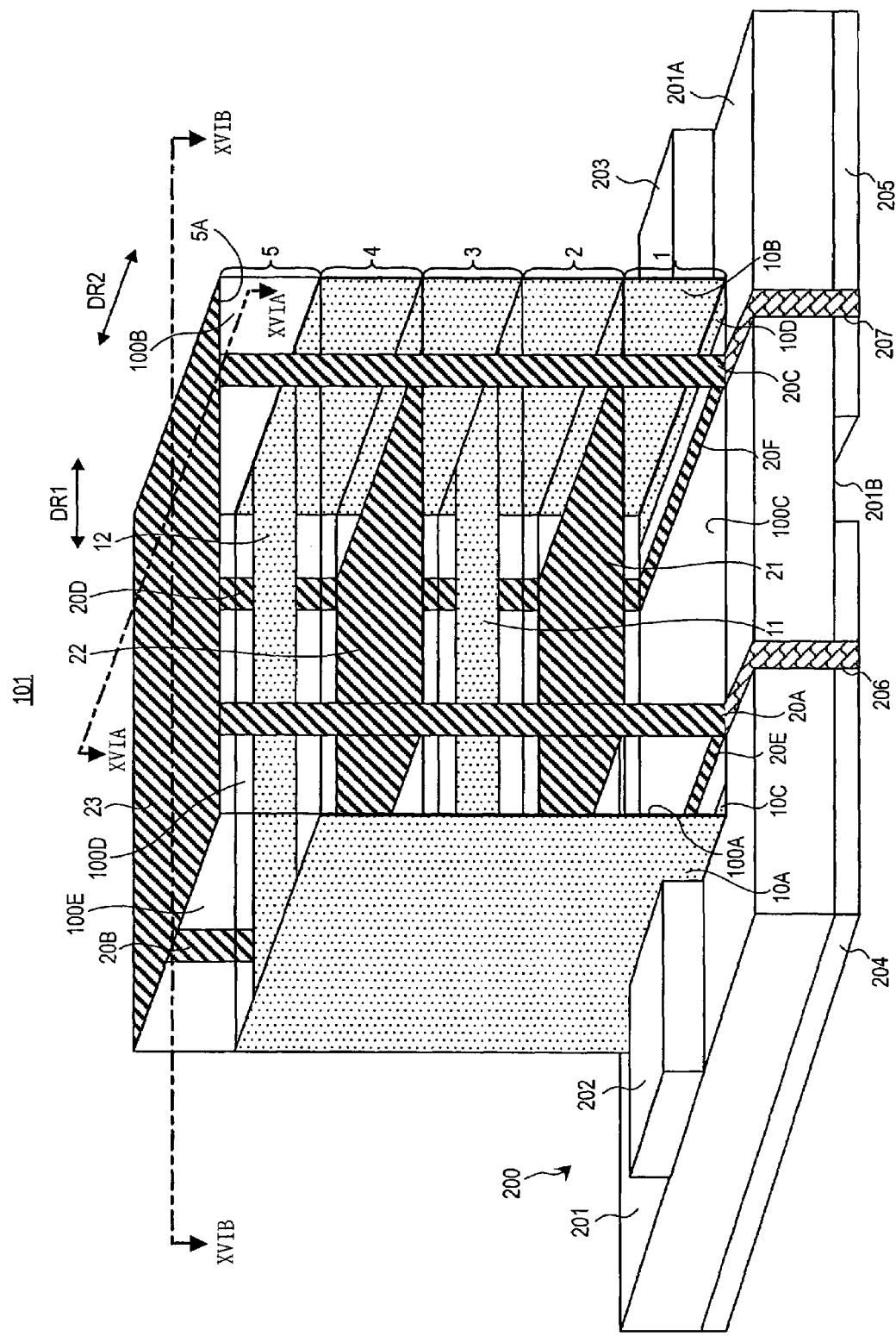

ND SUBSTRATE USED THEREFOR

The priority applications Numbers JP2005-372844 and JP2006-287298, upon which this patent application is based are hereby incorporated by reference.

BACKGROUND OF THE INVENTION

1. Field of the Invention

This invention relates to an electric circuit device and a substrate used therefor, and more particularly to an electric circuit device and a substrate used therefor functioning as a noise filter with a wide frequency coverage and excellent high-frequency characteristics.

2. Description of Related Art

Recently, digital circuit technology such as LSI (Large Scale Integrated) circuit technology is adopted in not only computers and communication-related equipment but also consumer electronics and in-vehicle equipment.

A high-frequency current produced in the LSI circuit or the like does not stay in the vicinity of the LSI circuit but flows to the wide area of a component-mounted circuit substrate such as a printed-circuit substrate. The high-frequency current then inductively couples to signal wires and grounding wires and leaks as an electromagnetic wave from signal cables or the like.

In mixed-signal circuits in which analog circuitry and digital circuitry are combined, for example, a circuit in which a part of a conventional analog circuit is replaced with a digital circuit, and a digital circuit having analog input/output, one of the serious problems is electromagnetic interference from the digital circuit to the analog circuit.

An effective solution of this problem is to separate the LSI circuit, which is a source of the high-frequency current, from a power supplying system with respect to the high frequency, that is to say a "power decoupling" technique. Known as a noise filter employing the power decoupling technique is a transmission-line type noise filter (e.g. Japanese unexamined patent publication No. 2004-80773).

This transmission-line type noise filter comprises a first electrical conductor, a second electrical conductor, a dielectric layer, a first anode and a second anode. Each first and second electrical conductors is in the form of a plate. The dielectric layer is disposed between the first and second electrical conductors.

The first anode is connected to one end of the first electrical conductor in a longitudinal direction, while the second anode is connected to the other end of the first electrical conductor in the longitudinal direction. The second electrical conductor functions as a cathode to connect to reference potential. The first electrical conductor, dielectric layer, and second electrical conductor constitute a capacitor. The thickness of the first electrical conductor is so set as to substantially prevent the temperature rise caused by a DC (direct current) component of the current flowing through the first electrical conductor.

The transmission-line type noise filter is connected between a power source and an LSI circuit so as to feed a current from the power source through a path made up of the first anode, the first electrical conductor and the second anode to the LSI circuit, while attenuating an AC (alternating current) current produced in the LSI circuit.

As discussed above, the transmission-line type noise filter has a structure of a capacitor, and uses the first and second electrical conductors, which are two electrodes of the capacitor, as transmission lines.

BRIEF SUMMARY OF THE INVENTION

However, the transmission-line type noise filter has impedance represented by (inductance/capacitance) 1/2 and does not employ measures which reduce inductance. The impedance transfers from a range dominated by capacitance to a range dominated by inductance, as frequency is high. As a result, the conventional transmission-line type noise filter has a problem of not having lower impedance than impedance determined by inductance which the transmission-line type noise filter basically has.

The present invention is made to solve the problems and has an object to pro vide an electric circuit device which is capable of reducing impedance due to a reducing inductance.

The present invention has another object to provide a substrate using for the electric circuit device which is capable of reducing impedance due to a reducing inductance.

According to the present invention, the electric circuit device comprises the substrate and an electric element. The substrate includes a first conductive plate. The electric element is formed on the substrate. The electric element then includes n-number (n is a positive integer) of a second conductive plate and m-number (m is a positive integer) of a third conductive plate. The n-number of the second conductive plate respectively passes a first current from the power source side to the electrical load circuit side. The m-number of the third conductive plate is alternately stacked to n-number of the second conductive plate and each passing a second current, which is a return current of the first current, from the electrical load circuit side to the power source side. The first conductive plate passes the second current, which is received from the electrical load circuit side, to one each end of the m-number of third conductive plate, while passing the second current, which is received from the other each end of the m-number of third conductive plate, to the power source side. When the first and second currents respectively flows in the n-number of second conductive plate and the m-number of third conductive plate, the n-number of second conductive plate has lower inductance than self-inductance. When the length of the second and third conductive plates along the direction perpendicular to the direction in which the first and second currents flow is W, and the length of the second and third conductive plates along the direction in which the first and second currents flow is L, in the overlap part between the second and third conductive plates, W and L have a relationship of W≧L. The second current includes a component of the first current passing in the m-number of third conductive plate and a component of the second current passing in the first conductive plate. The first conductive plate includes a first flat plate member connected to the one each end of the m-number of third conductive plate, a second flat plate member connected to the other each end of the m-number of third conductive plate, and a current control unit being disposed between the first flat plate member and the second flat plate member and more reducing the component of second current than that of first current.

Preferably, the current control unit sets a component of the second current to zero.

According to the present invention, the electric circuit device comprises the substrate and the electric element. The substrate includes the first conductive plate. The electric element is formed on the substrate. The electric element then includes n-number (n is a positive integer) of the second conductive plate and m-number (m is a positive integer) of the third conductive plate. The n-number of the second conductive plate respectively passes the first current from the power source side to the electrical load circuit side. The m-number of the conductive plate is alternately stacked to n-number of the second conductive plate and each passing the second current, which is the return current of the first current, from the electrical load circuit side to the power source side. The first conductive plate passes the second current, which is received from the electrical load circuit side, to one each end of the m-number of third conductive plate, while passing the second current, which is received from the other each end of the m-number of third conductive plate, to the power source side. When the first and second currents respectively flows in the n-number of second conductive plate and the m-number of third conductive plate, the n-number of second conductive plate has lower inductance than self-inductance. When the length of the second and third conductive plates along the direction perpendicular to the direction in which the first and second currents flow is W, and the length of the second and third conductive plates along the direction in which the first and second currents flow is L, in the overlap part between the second and third conductive plates, W and L have a relationship of $W \geqq L$. The first conductive plate includes the first flat plate member being connected to one each end of the m-number of third conductive plate and the second flat plate member being connected to the other each end of the m-number of third conductive plate and being separated from the first flat plate member.

According to the present invention, the electric circuit device comprises n-number (n is a positive integer) of the first conductive plate and m-number (m is a positive integer) of the second conductive plate. The n-number of the first conductive plate respectively passes the first current from the power source side to the electrical load circuit side. The m-number of the second conductive plate is alternately stacked to n-number of the first conductive plate and each passing the second current, which is the return current of the first current, from the electrical load circuit side to the power source side. When the first and second currents respectively flows in the n-number of first conductive plate and the m-number of second conductive plate, the n-number of first conductive plate has lower inductance than self-inductance. When the length of the first and second conductive plates along the direction perpendicular to the direction in which the first and second currents flow is W, and the length of the first and second conductive plates along the direction in which the first and second currents flow is L, in the overlap part between the first and second conductive plates, W and L have a relationship of $L \geqq W$.

Preferably, the electric circuit device further comprises the substrate. The substrate includes the third conductive plate. The n-number of the first conductive plate and the m-number of the second conductive plate are formed on the substrate. The second current includes a component of the first current passing in the m-number of second conductive plate and a component of the second current passing in the third conductive plate. The third conductive plate includes the first flat plate member connected to the one each end of the m-number of second conductive plate, the second flat plate member connected to the other each end of the m-number of second conductive plate, and the current control unit being disposed between the first flat plate member and the second flat plate member and more reducing the component of second current than that of first current.

Preferably, the current control unit zeros in the component of second current.

Preferably, the electric circuit device further comprises the substrate. The substrate includes the third conductive plate. The n-number of first conductive plate and m-number of second conductive plate are formed on the substrate. The third conductive plate includes the first flat plate member connected to one each end of the m-number of second conductive plate and the second flat plate member connected to the other each end of the m-number of second conductive plate and separated from the first flat plate member.

Preferably, the distance between the first flat plate member and the second flat plate member is set to relatively large value.

Preferably, the electric circuit device further includes the substrate where the n-number of first conductive plate and the m-number of second conductive plate are placed. The substrate includes the third conductive plate formed on the principal surface and first to third slits. The first slit forms a first conductor part, which is connected to the one each end of the n-number of first conductive plate, on the principal surface. A second slit forms a second conductor part, which is connected to the other each end of the n-number of first conductive plate, on the principal surface. A third slit is disposed between the first slit and the second slit and forms third and fourth conductor parts, which are connected to each both ends of the m-number of second conductive plate, on the principal surface.

Preferably, the substrate further includes a fourth slit extending from the third slit along the direction approximately perpendicular to the direction in which the second current flows Preferably, the substrate further includes a fifth slit being formed on both ends of the fourth slit and extending along the direction of the predefined angle to the fourth slit.

According to the present invention, the substrate can relatively reduce impedance of the electric element. The electric element includes n-number (n is a positive integer) of the first conductive plate and m-number (m is a positive integer) of the second conductive plate. The n-number of the first conductive plate respectively passes the first current from the power source side to the electrical load circuit side. The m-number of the second conductive plate is alternately stacked to n-number of the first conductive plate and each passing the second current, which is the return current of the first current, from the electrical load circuit side to the power source side. When the first and second currents respectively flows in the n-number of first conductive plate and the m-number of second conductive plate, the n-number of first conductive plate has lower inductance than self-inductance. The substrate comprises the dielectric, third conductive plate, and fourth conductive plate. The third conductive plate is placed on the principal surface of dielectric and is connected to one each end of the m-number of second conductive plate, while the fourth conductive plate is placed on the principal surface at the predefined distance away from the third conductive plate and is connected to the other each end of the m-number of second conductive plate.

Preferably, the substrate further includes first and second signal wires. The first signal wire is placed on the principal surface of dielectric and is connected to one each end of the n-number of first conductive plate, while the second signal wire is placed on the principal surface where the first signal wire is placed and is connected to the other each end of the n-number of first conductive plate. The third and fourth conductive plates are placed on the same principal surface as the first and second signal wires.

Preferably, the third conductive plate includes the first and second flat plate members disposed on both sides of the first signal wire, while the fourth conductive plate includes the third and fourth flat plate members disposed on both sides of the second signal wire.

Preferably, the substrate further includes the first and second signal wires. The first signal wire is placed on the principal surface of dielectric and is connected to one each end of the n-number of the first conductive plate, while the second signal wire is placed on the principal surface where the first signal wire is placed and is connected to the other each end of the n-number of the first conductive plate. The third and fourth conductive plates are placed on the different principal surface from the first and second signal wires.

Preferably, the substrate further includes the first and second signal wires. The first signal wire is placed on the principal surface of dielectric and is connected to one each end of the n-number of the first conductive plate, while the second signal wire is placed on the principal surface where the first signal wire is placed and is connected to the other each end of the n-number of the first conductive plate. The third conductive plate includes the first to third flat plate members. The first and second flat plate members are disposed on both sides of the first signal wire on the same principal surface as the first signal wire. The third flat plate member is placed on the different principal surface from the first signal wire. The fourth conductive plate includes fourth to sixth flat plate members. The forth and fifth flat plate members are disposed on both sides of the second signal wire on the same principal surface as the second signal wire. The sixth flat plate member is disposed on the different principal surface from the second signal wire.

Preferably, the dielectric includes a plurality of stacked dielectric layers. The third conductive plate includes a plurality of the first flat plate members disposed on front and rear faces of each dielectric, while the fourth conductive plate includes a plurality of the second flat plate members disposed on front and rear faces of each dielectric.

Preferably, the substrate further includes the first and second signal wires. The first signal wire is placed on the principal surface of a top one of the plurality of dielectrics and is connected to one each end of the n-number of first conductive plate. The second signal wire is placed on the principal surface where the first signal wire is placed and is connected to the other each end of the n-number of first conductive plate. Of the plurality of first flat plate members, a flat plate member, which is disposed on the principal surface of the top one of the dielectrics, includes first and second flat plate parts disposed on both sides of the first signal wire. Of the plurality of second flat plate members, a flat plate member, which is disposed on the principal surface of the top one, includes third and fourth flat plate parts disposed on both sides of the second signal wire.

Preferably, the predefined distance is set to relatively large value.

According to the present invention, the substrate relatively reduces impedance of the electric element. The electric element includes n-number (n is a positive integer) of the first conductive plate and m-number (m is a positive integer) of the second conductive plate. The n-number of first conductive plate respectively passes the first current from the power source side to the electrical load circuit side. The m-number of the second conductive plate is alternately stacked to n-number of the first conductive plate and each passing the second current, which is the return current of the first current, from the electrical load circuit side to the power source side. When the first and second currents respectively flow in the n-number of first conductive plate and the m-number of second conductive plate, the n-number of first conductive plate has lower inductance than the self-inductance. The substrate comprises the dielectric, third conductive plate, and first to third slits. The third conductive plate is placed on a principal surface of dielectric. The first slit forms the first conductor part, which is connected to one each end of the n-number of first conductive plate, on the principal surface. The second slit forms the second conductor part, which is connected to the other each end of the n-number of first conductive plate, on the principal surface. The third slit is disposed between the first slit and the second slit and forms the third and fourth conductor parts, which are respectively connected to each both ends of the m-number of second conductive plate, on the principal surface.

Preferably, the substrate further includes the fourth slit extending from the third slit along the direction approximately perpendicular to the direction in which the second current flows.

Preferably, the substrate further includes the fifth slit being formed on both ends of the fourth slit and extending along the direction of the predefined angle to the fourth slit.

According to the present invention, the electric circuit device includes overlap part between the n-number of first conductive plate passing the first current from the power source side to the electrical load circuit side and the m-number of second conductive plate passing the second current, which is the return current of the first current, from the electrical load circuit side to the power source side. The overlap part is in the form of approximately rectangular along the direction in which the first and second currents flow. As a result, a magnetic coupling between the n-number of first conductive plate and the m-number of second conductive plate is relatively increased, thereby more reducing each effective inductance of the n-number of first conductive plate than self-inductance of the first conductive plate.

According to the present invention, the impedance of the electric circuit device can be reduced due to a reducing inductance.

According to the present invention, since the electric circuit device comprises the substrate leading the return current to the m-number of third conductive plate, the magnetic coupling between the n-number of second conductive plate and the m-number of third conductive plate is relatively increased, thereby more reducing each effective inductance of the n-number of second conductive plate than self-inductance of the second conductive plate.

According to the present invention, the lower inductance thus can reduce the impedance of the electric circuit device.

BRIEF DESCRIPTION OF THE DRAWINGS

FIG. 15 is a perspective view for fully describing the electric circuit device shown in FIG. 13.

DETAILED DESCRIPTION OF THE PREFERRED EMBODIMENTS

Figure 1:
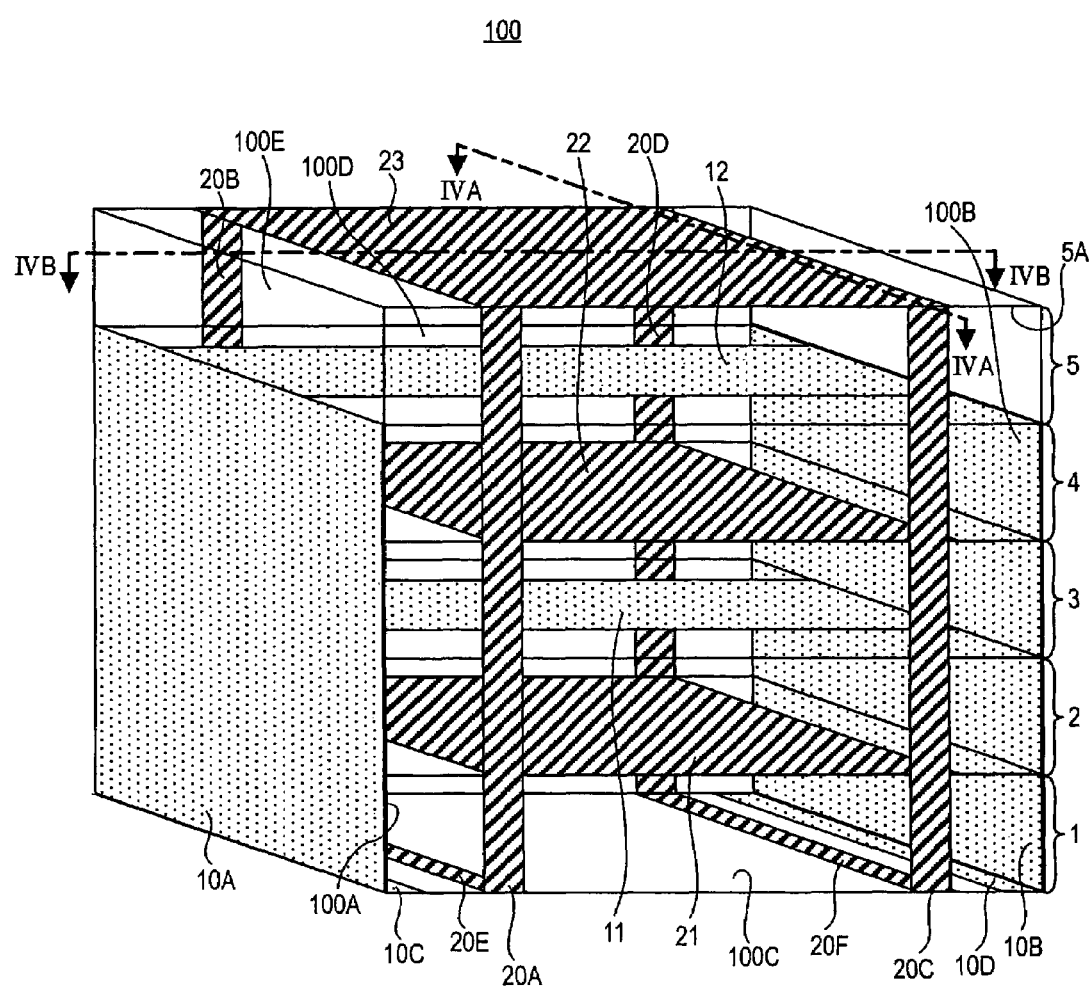
FIG. 1 is a schematic view illustrating the structure of an electric circuit device according to the first embodiment of the present invention.

Referring to the drawings, a detailed description will be made on embodiments of the present invention. Components identical or equivalent to each other in the drawings are denoted by the same reference number, and will not be further explained to avoid repetition.

The First Embodiment

FIG. 1 is a schematic view illustrating the structure of an electric circuit device according to the first embodiment of the present invention. Referring to FIG. 1, an electric circuit device 100 according to the first embodiment of the present invention comprises dielectric layers 1 to 5, conductive plates 11, 12, 21 to 23, side anode electrodes 10A, 10B, anode electrodes 10C, 10D, side cathode electrodes 20A, 20B, 20C, 20D, and cathode electrodes 20E, 20F.

The dielectric layers 1 to 5 are stacked in sequence. The conductive plates 11, 12, 21 to 23 are in the form of a flat plate each. The conductive plate 21 is placed between the dielectric layers 1 and 2, while the conductive plate 11 is placed between the dielectric layers 2 and 3. The conductive plate 22 is placed between the dielectric layers 3 and 4, while the conductive plate 12 is placed between the dielectric layers 4 and 5. The conductive plate 23 is placed on a principal surface 5A of the dielectric layer 5. As a result, the dielectric layers 1 to 5 support the conductive plates 21, 11, 22, 12, and 23, respectively.

The side anode electrode 10A is connected to one end of the conductive plates 11, 12 and is formed on a side face 100A of the electric circuit device 100. The side face 100A is made up of the side faces of the dielectric layers 1 to 4. The side anode electrode 10B is connected to the other end of the conductive plates 11, 12 and is formed on a side face 100B (which is made up of the side faces of the dielectric layers 1 to 4) opposite to the side face 100A of the electric circuit device 100. Therefore, the side anode electrode 10B is opposed to the side anode electrode 10A.

The anode electrode 10C is disposed on a bottom face 100C of the electric circuit device 100 and is connected to the side anode electrode 10A, while the anode electrode 10D is disposed on the bottom face 100C of the electric circuit device 100 and is connected to the side anode electrode 10B.

The side cathode electrode 20A is connected to the conductive plates 21 to 23 in the proximity of one end side of the conductive plates 21 to 23 and is disposed on a front face 100D of the electric circuit device 100. The side cathode electrode 20B is connected to the conductive plates 21 to 23 in the proximity of one end side of the conductive plates 21 to 23 and is disposed on a rear face 100E opposite to the front face 100D of the electric circuit device 100. Therefore, the side cathode electrode 20B is opposed to the side cathode electrode 20A.

The side cathode electrode 20C is connected to the conductive plates 21 to 23 in the proximity of other end side of the conductive plates 21 to 23 and is disposed on the front face 100D of the electric circuit device 100. The side cathode electrode 20D is connected to the conductive plates 21 to 23 in the proximity of other end side of the conductive plates 21 to 23 and is disposed on the rear face 100E opposite to the front face 100D of the electric circuit device 100. Therefore, the side cathode electrode 20D is opposed to the side cathode electrode 20C.

The cathode electrode 20E is connected to the side cathode electrodes 20A, 20B and is disposed on the bottom face 100C of the electric circuit device 100. The cathode electrode 20F is connected to the side cathode electrodes 20C, 20D and is disposed on the bottom face 100C of the electric circuit device 100.

As discussed above, the electric circuit device 100 has the conductive plates 11, 12, 21 to 23 alternately placed with the dielectric layers 1 to 5 interposed therebetween, and includes the two anode electrodes 10C, 10D and two cathode electrodes 20E, 20F.

Each dielectric layers 1 to 5 are composed of, for example, barium titanate ($BaTiO_3$). The side anode electrodes 10A, 10B, anode electrodes 10C, 10D, conductive plates 11, 12, 21 to 23, side cathode electrodes 20A, 20B, 20C, 20D and cathode electrodes 20E, 20F are composed of, for example, nickel (Ni).

Figure 2:
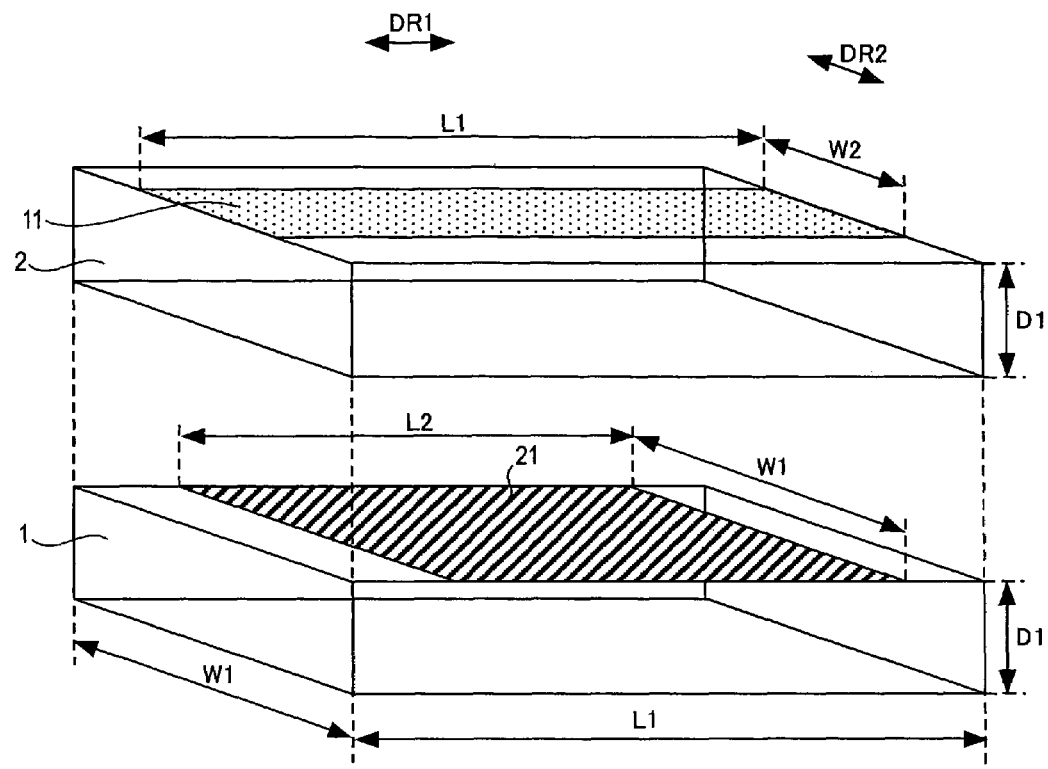
FIG. 2 is a diagram for describing dimensions of dielectric layers and conductive plates shown in FIG. 1.

FIG. 2 is a diagram for describing dimensions of dielectric layers 1, 2 and conductive plates 11, 21 shown in FIG. 1. Referring to FIG. 2, each dielectric layers 1, 2 has length L1 along the direction DR1, which is the direction of a current flowing in the conductive plates 11, 21, width W1 along the direction DR2 perpendicular to the direction DR1, and thickness D1. Length L1, width W1, and thickness D1 are set, for example, at 15 mm, 13 mm, and 25 μm, respectively.

The conductive plate 11 has length L1 and width W2. Width W2 is set, for example, at 11 mm. The conductive plate 21 has length L2 and width W1. Length L2 is set, for example, at 13 mm. Each conductive plates 11, 21 has a thickness, for example, in a range between 10 μm to 20 μm.

Each dielectric layers 3 to 5 has the same length L1, width W1, and thickness D1 as those of the dielectric layers 1, 2 shown in FIG. 2. The conductive plate 12 has the same length L1, width W2 and thickness as those of the conductive plate 11 shown in FIG. 2. Each conductive plates 22, 23 has the same length L2, width W1, and thickness as those of the conductive plate 21 shown in FIG. 2.

As discussed above, the conductive plates 11, 12 are different in length and width from the conductive plates 21 to 23. These differences are made to prevent shorting between the side anode electrodes 10A, 10B connected to the conductive plates 11, 12 and the side cathode electrodes 20A, 20B, 20C, 20D connected to the conductive plates 21 to 23.

Figure 3:
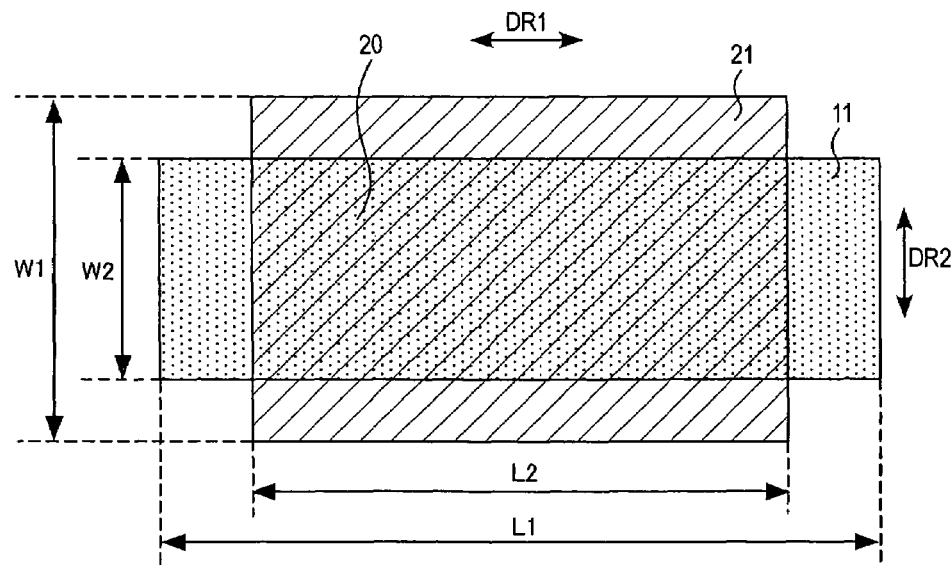
FIG. 3 is a plan view illustrating two adjacent conductive plates.

FIG. 3 is a plan view illustrating two adjacent conductive plates. Suppose the conductive plate 11 and conductive plate 21 are in one plane, with reference to FIG. 3, the conductive plates 11 and 21 have an overlap part 20. The overlap part 20 between the conductive plate 11 and conductive plate 21 has length L2 and width W2. Overlap parts between the conductive plate 11 and conductive plate 22, between the conductive plate 12 and conductive plate 22, and between the conductive plate 12 and conductive plate 23 have the same length L2 and width W2 as those of the overlap part 20. In the first embodiment, length L2 and width W2 are set so as to hold W2≦L2.

Figure 4A:
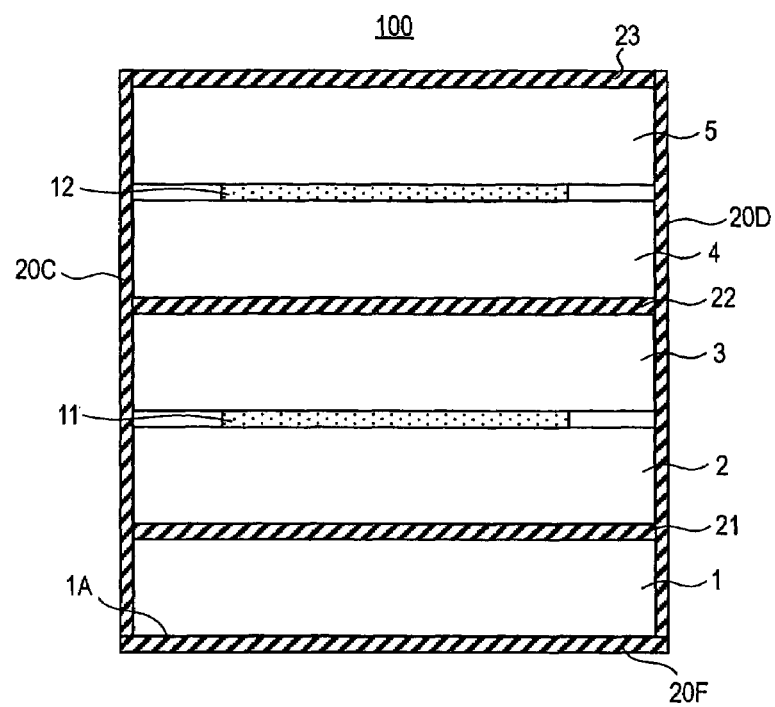
FIGS. 4A and 4B are cross-sectional views of the electric circuit device shown in FIG. 1.
Figure 4B:
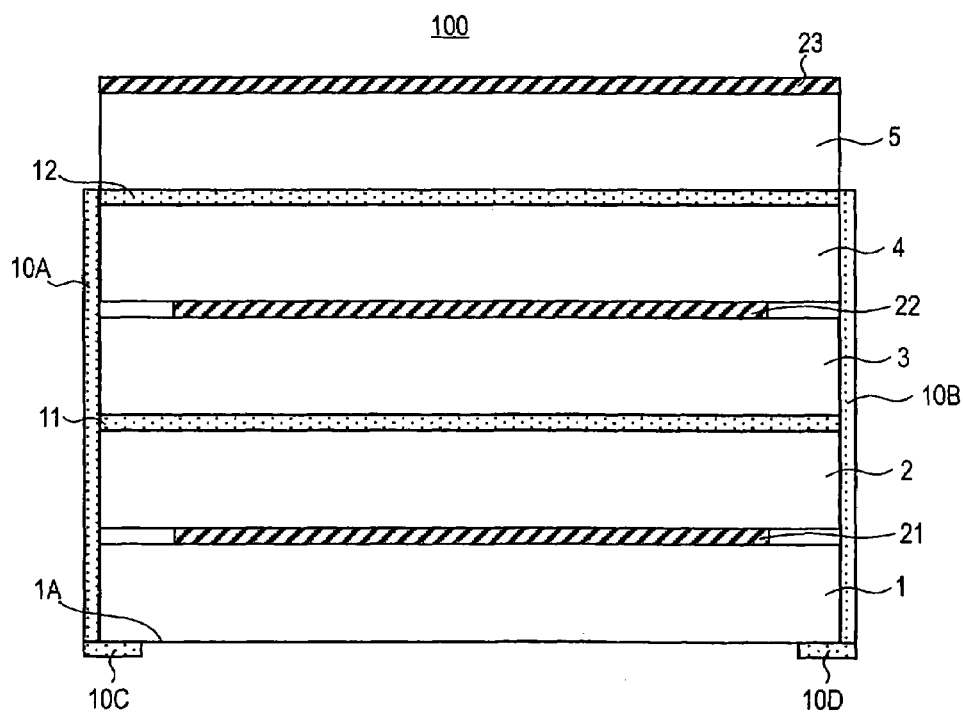

FIGS. 4A and 4B are cross-sectional views of the electric circuit device 100 shown in FIG. 1. FIG. 4A is a cross-sectional view of the electric circuit device 100 as taken along line IVA-IVA of FIG. 1, while FIG. 4B is a cross-sectional view of the electric circuit device 100 as taken along line IVB-IVB of FIG. 1.

Referring to FIG. 4A, the conductive plate 21 is in contact with both dielectric layers 1 and 2, while the conductive plate 11 is in contact with both dielectric layers 2 and 3. The conductive plate 22 is in contact with both dielectric layers 3 and 4, while the conductive plate 12 is in contact with both dielectric layers 4 and 5. In addition, the conductive plate 23 is in contact with the dielectric layer 5.

The side cathode electrodes 20C, 20D are not connected to the conductive plates 11, 12, but to the conductive plates 21 to 23. The cathode electrode 20F is disposed under an underside 1A of the dielectric layer 1 and is connected to the side cathode electrodes 20C, 20D.

Referring to FIG. 4B, the side anode electrodes 10A, 10B are not connected to the conductive plates 21 to 23, but to the conductive plates 11, 12. The anode electrodes 10C, 10D are disposed under an underside 1A of the dielectric layer 1 and are connected to the side anode electrodes 10A, 10B, respectively.

Therefore, a group of conductive plate 21, dielectric layer 2 and conductive plate 11, a group of the conductive plate 11, dielectric layer 3 and conductive plate 22, a group of the conductive plate 22, dielectric layer 4 and conductive plate 12, and a group of the conductive plate 12, dielectric layer 5 and conductive plate 23 constitute four capacitors connected in parallel between the anode electrodes 10C and 10D and the cathode electrodes 20E and 20F.

In this case, each capacitor has an electrode area equal to that of the overlap part 20 (see FIG. 3) of the two adjacent conductive plates.

Figure 5A:
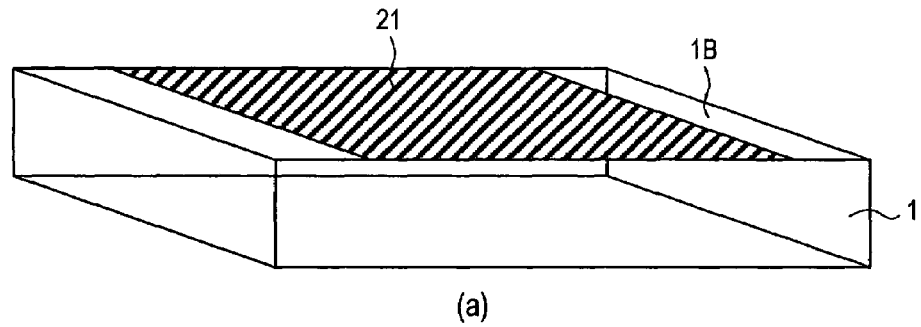
FIGS. 5A to 5C are the first process drawing for describing a fabricating method of the electric circuit device shown in FIG. 1.
Figure 5B:
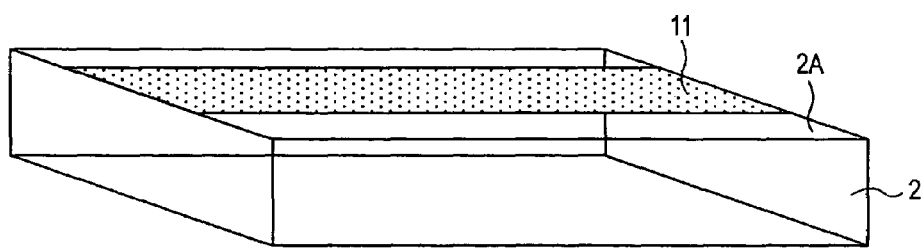
Figure 5C:
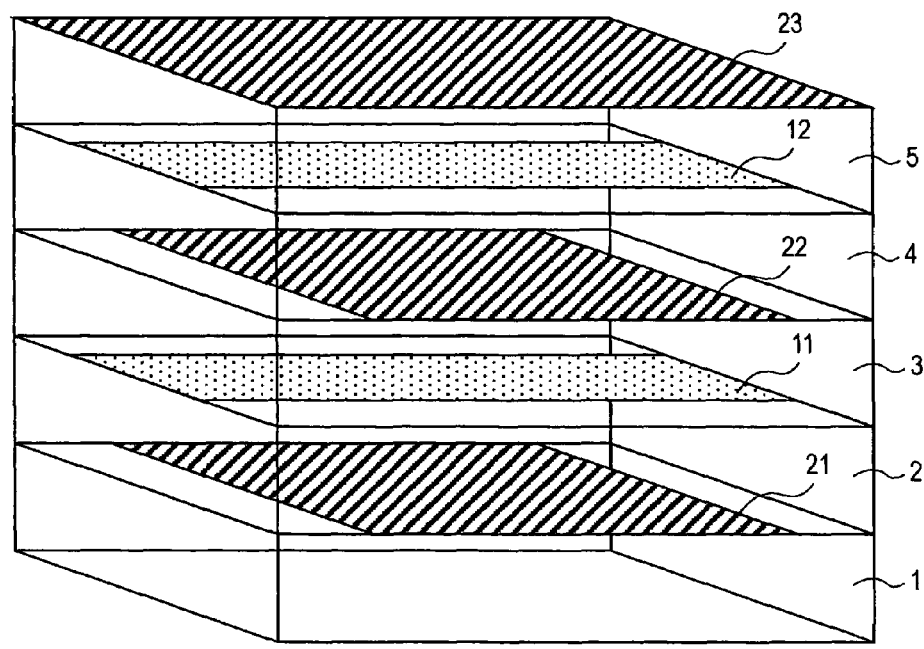

FIGS. 5A to 5C and FIGS. 6A and 6B are the first and second process drawings, respectively, for describing a fabricating method of the electric circuit device 100 shown in FIG. 1. Referring to FIGS. 5A to 5C, a green sheet, which will be the dielectric layer 1 (BaTiO3), having length L1, width W1 and thickness D1 is prepared. In an area having length L2 and width W1 on the front face 1B of the green sheet, Ni paste is applied by screen printing to form the conductive plate 21 composed of Ni on the front face 1B of the dielectric layer 1.

Similarly, after the dielectric layers 3, 5 composed of BaTiO3 are prepared, the conductive plates 22, 23 composed of Ni are formed on the prepared dielectric layers 3, 5, respectively (see FIG. 5A).

Subsequently, a green sheet, which will be the dielectric layer 2 (BaTiO3), having length L1, width W1 and thickness D1 are prepared. In an area having length L1 and width W2 on the front face 2A of the green sheet, Ni paste is applied by screen printing to form the conductive plate 11 composed of Ni on the front face 2A of the dielectric layer 2.

Similarly, after the dielectric layer 4 composed of BaTiO3 is prepared, the conductive plate 12 composed of Ni is formed on the prepared dielectric layer 4 (see FIG. 5B).

The green sheets of the dielectric layers 1 to 5 on which conductive plates 21, 11, 22, 12, 23 are respectively formed, are successively laminated (see FIG. 5C). This successive lamination results in alternate lamination of the conductive plates 11, 12 to be connected to the anode electrodes 10C, 10D and the conductive plates 21 to 23 to be connected to the cathode electrodes 20E, 20F.

Figure 6A:
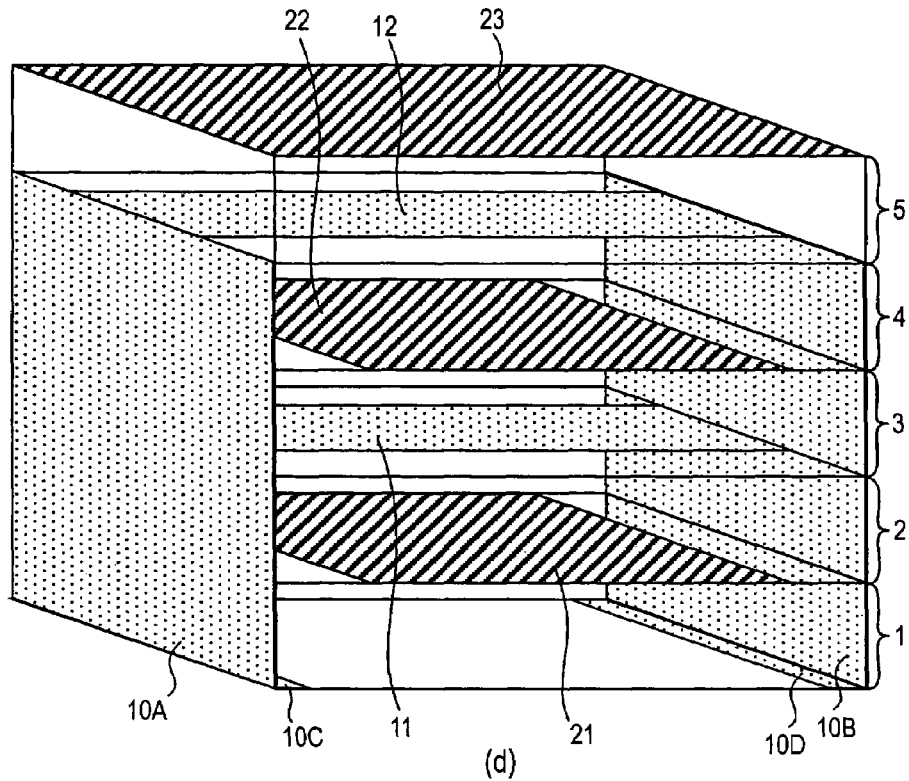
FIGS. 6A and 6B are the second process drawing for describing a fabricating method of the electric circuit device shown in FIG. 1.
Figure 6B:
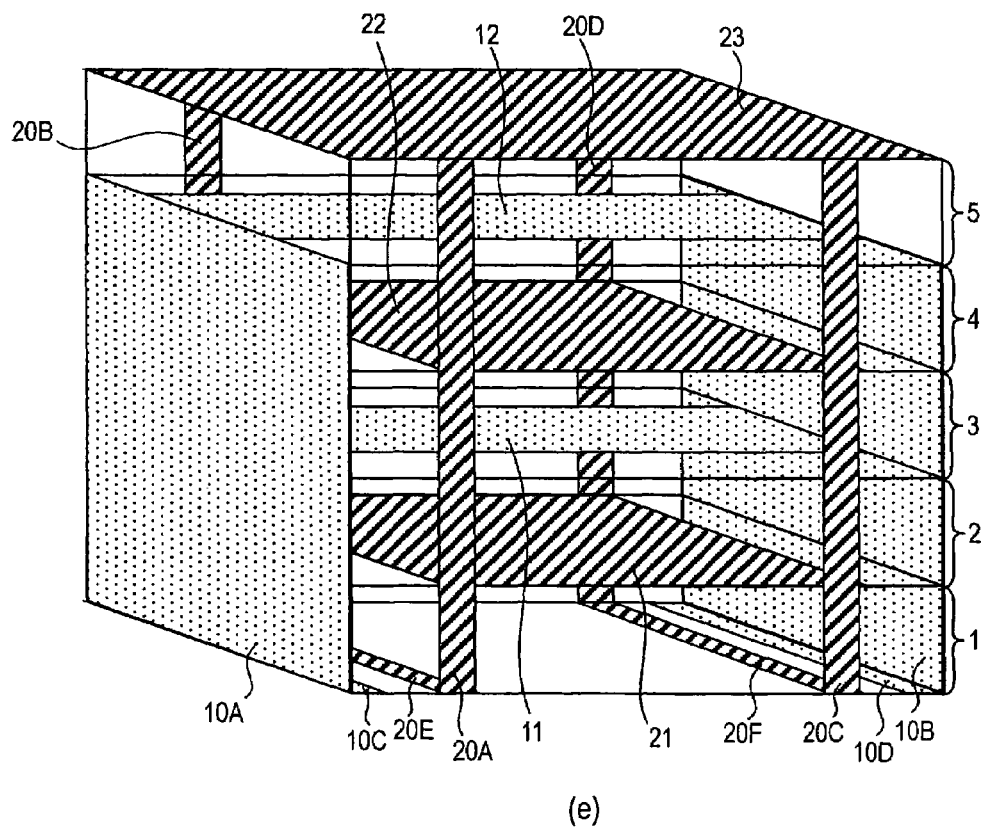

Then, the Ni paste is applied by the screen printing to form the side anode electrodes 10A, 10B, anode electrodes 10C, 10D, side cathode electrodes 20A, 20B, 20C, 20D and cathode electrodes 20E, 20F (see FIGS. 6A and 6B). The element fabricated as shown in FIG. 6B is annealed at a temperature of 1350 degrees C. to complete the electric circuit device 100. Alternatively, the side electrodes (external electrodes) can be made of materials having a lower melting point and higher conductivity than that of the internal electrodes (conductive plates 11, 12, 21 to 23) by use of post-fire. Further, the annealed side electrodes (external electrodes) may require plating with Ni, Au, Su or other materials, if necessary, under consideration of solder wettability.

There is another method of fabricating the electric circuit device 100 without the green sheets. In the method, a process of printing and drying dielectric paste and a process of printing a conductor on the dried dielectric paste are repeatedly performed to stack the dielectric layers and conductive plates.

Figure 7:
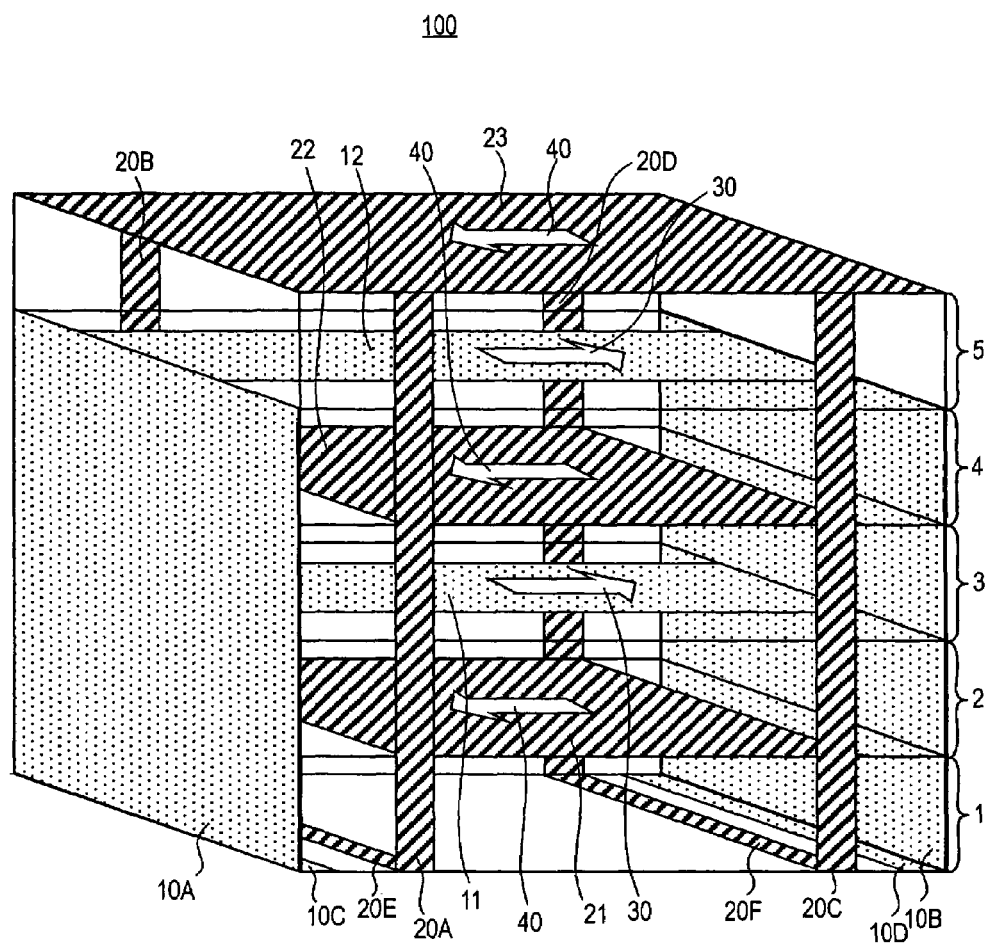
FIG. 7 is a perspective view for describing the functions of the electric circuit device shown in FIG. 1.

FIG. 7 is a perspective view for describing the functions of the electric circuit device 100 shown in FIG. 1. Referring to FIG. 7, current flows to the electrical circuit device 100 with the cathode electrodes 20E, 20F connected to ground potential so as to flow in the conductive plates 11, 12 in the opposite direction to the current flowing in the conductive plates 21 to 23.

If a current is fed to the electric circuit device 100 so as to flow from the anode electrode 10C to the anode electrode 10D, for example, the current passes from the anode electrode 10C through the side anode electrode 10A to the conductive plates 11, 12. The current then passes through the conductive plates 11, 12 in the direction of arrow 30, and further flows from the side anode electrode 10B to the anode electrode 10D.

A return current of the current flowing in the conductive plates 11, 12 passes from the cathode electrode 20F through the side cathode electrodes 20C, 20D to the conductive plates 21 to 23. The return current then passes through the conductive plates 21 to 23 in the direction of arrow 40, which is opposite to the arrow 30, and further flows from the side cathode electrodes 20A, 20B to the cathode electrode 20E.

In this configuration, a current I1 flowing through the conductive plates 11, 12 and a current I2 flowing through the conductive plates 21 to 23 are equal in magnitude and opposite in direction.

Figure 8:
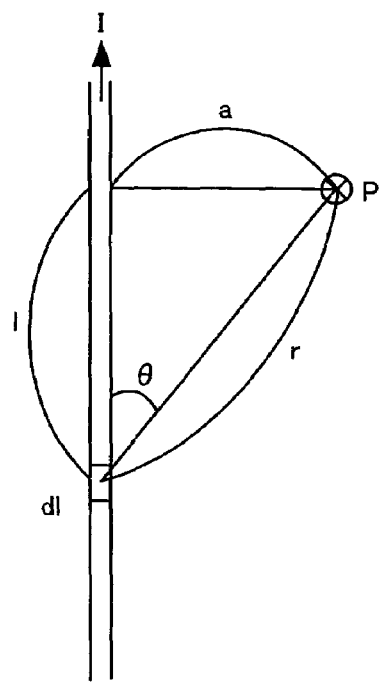
FIG. 8 is a view for describing magnetic flux density produced by an electric current passing through a conductive wire.
Figure 9:
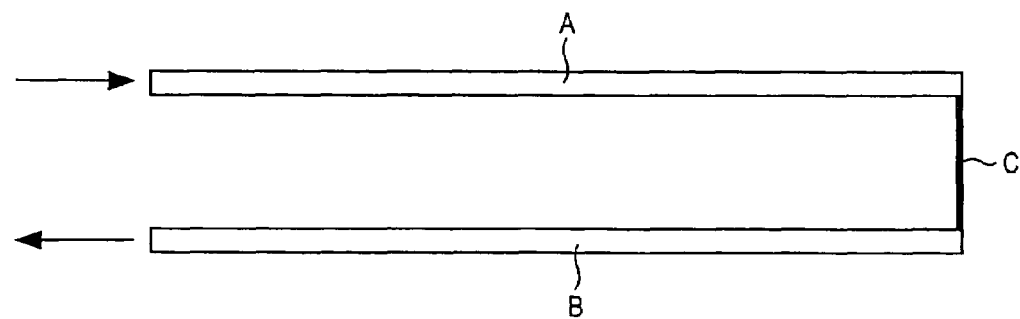
FIG. 9 is a view for describing effective inductance upon the occurrence of magnetic interference between two conductive wires.

FIG. 8 is a view for describing magnetic flux density produced by an electric current passing through a conductive wire. FIG. 9 is a view for describing effective inductance upon the occurrence of magnetic interference between two conductive wires.

Referring to FIG. 8, when an electric current I is flowing in an infinitely long straight wire, a magnetic flux density B at a point P at distance a from the wire is expressed by:

$$B = \frac{\mu_0 I}{2\pi r} \quad (1)$$

In this expression, $\mu_0$ indicates magnetic permeability in a vacuum.

Alternatively, when the conductive wire shown in FIG. 8 is replaced with two conductive wires that mutually cause magnetic interference, mutual inductance $L_{12}$ is expressed as below, where self-inductances of the two conductive wires are $L_{11}$ and $L_{22}$, respectively, and coupling coefficient is k(0<k<1), and the mutual inductance of the two conductive wires is $L_{12}$.

$$L_{12} = k \cdot \sqrt{L_{11} \cdot L_{22}} \quad (2)$$

If $L_{11} = L_{22}$, the mutual inductance $L_{12}$ is expressed by:

$$L_{12} = k \cdot L_{11} \quad (3)$$

Referring to FIG. 9, given that a conductive wire A and conductive wire B are connected by a lead wire C and both have an electric current flowing therethrough that are equal in magnitude but opposite in direction, effective inductance $L_{11\,effective}$ of the conductive wire A is expressed by:

$$L_{11\,effective} = L_{11} - L_{12} \quad (4)$$

As discussed above, the magnetic interference occurred between the conductive wire A and the conductive wire B creates the mutual inductance $L_{12}$, which causes the effective inductance $L_{11\,effective}$ of the conductive wire A to be smaller than the self-inductance $L_{11}$ of the conductive wire A. This is because the direction of magnetic flux $\phi_A$ produced by the electric current I flowing in the conductive wire A is opposite to the direction of magnetic flux $\phi_B$ produced by the electric current −I flowing in the conductive wire B, therefore effective magnetic flux density produced by the electric current I in the conductive wire A is reduced.

Figure 10A:
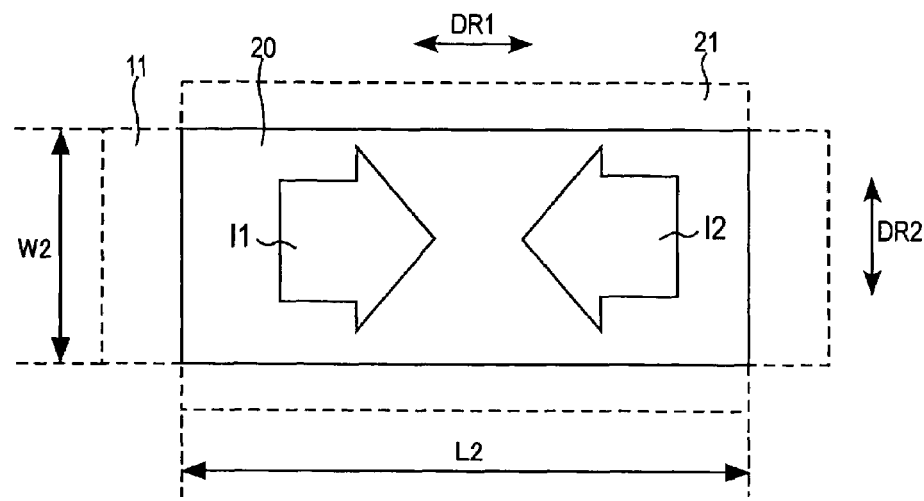
FIGS. 10A and 10B are conceptual illustrations for describing a mechanism that can reduce the inductance of the electric circuit device shown in FIG. 1.
Figure 10B:
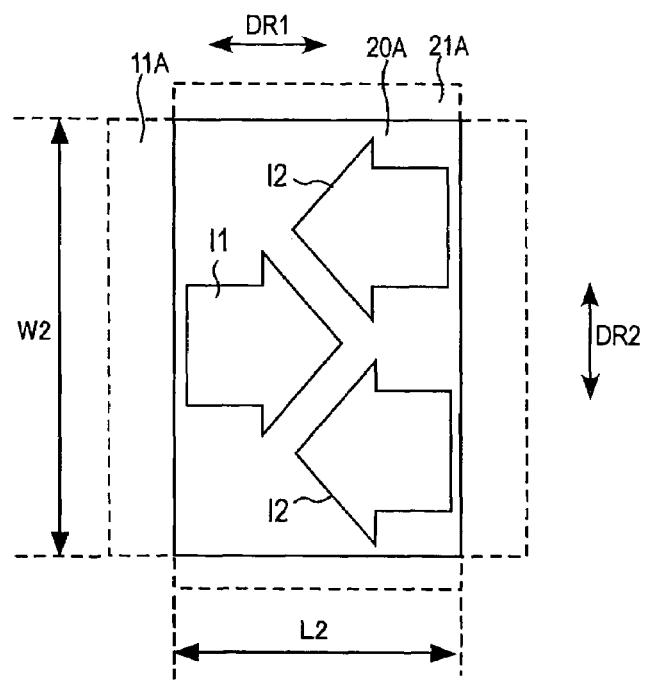

FIGS. 10A and 10B are conceptual illustrations for describing a mechanism that can reduce the inductance of the electric circuit device 100 shown in FIG. 1.

In the above-discussed electric circuit device 100, the conductive plate 11 is located 25 μm away from the conductive plates 21, 22 and the conductive plate 12 is located 25 μm away from the conductive plates 22, 23. Because of this, magnetic interference occurs between the conductive plate 11 and each conductive plates 21, 22 and between the conductive plate 12 and each conductive plates 22, 23. Since the current I1 flowing in the conductive plates 11, 12 and the current I2 flowing in the conductive plates 21 to 23 are equal in magnitude but opposite in direction, the effective inductance of the conductive plates 11, 12 becomes smaller than the self-inductance of the conductive plates 11, 12 due to the mutual inductance between the conductive plates 11, 12 and the conductive plates 21 to 23.

In this case, the self-inductance of the conductive plates 11, 12 where length L2 not less than width W2 in the overlap part 20 between the conductive plate 11, 12 and the conductive plates 21 to 23 is significantly lower than that where length L2 shorter than width W2 in the overlap part 20. The reason will be described by referring to FIGS. 10A and 10B.

FIG. 10A illustrates a case that length L2 is not less than width W2 in the overlap part 20. FIG. 10B illustrates a case that length L2 is shorter than width W2 in the overlap part 20. In FIGS. 10A and 10B, an arrow shows an electric current with a spread in direction DR2. In FIGS. 10A and 10B, each of the overlap parts 20 has equal area.

Referring to FIG. 10A, the current I1 flows in the conductive plate 11, while the current I2 flows in the conductive plate 21. Where length L2 is not less than width W2 in the overlap part 20, the currents I1, I2 flow almost entirely in width W2 of the overlap part 20, and then flow in the conductive plates 11, 21, respectively. Since a magnetic flux $\phi_B$ produced by the current I2 flowing in the conductive plate 21 significantly and relatively deny a magnetic flux $\phi_A$ produced by the current I1 flowing in the conductive plate 11, the effective inductance of the conductive plate 11 becomes significantly and relatively smaller than the self-inductance of the conductive plate 11 due to the mutual inductance between the conductive plates 11 and 21. The effective inductance of the conductive plate 12 becomes significantly and relatively smaller than the self-inductance of the conductive plate 12, as well.

Referring to FIG. 10B, where length L2 is shorter than width W2 in the overlap part 20, the current I1 flows in the central area of the conductive plate 11 along the direction DR2, while the current I2 flows in the edge area of the conductive plate 21 along the direction DR 2.

Where length L2 is shorter than width W2, impedance when a current I1, which is introduced in the conductive plate 11 from the side anode electrode 10A, flows to a longitudinal direction DR1 in the conductive plate 11 is less than impedance when the current I1 flows to a width direction DR2 in the conductive plate 11.

Where length L2 is shorter than width W2, impedance when the current I2 flows to the longitudinal direction DR1 of the conductive plate 21 is less than impedance when the current I2 introduced in the conductive plate 21 from the side cathode electrodes 20C, 20D flows to the width direction DR2 in the conductive plate 21.

When length L2 is shorter than width W2 in the overlap part 20, the current I1 flows in the central area of the overlap part 20 along the width direction DR2, while the current I2 flows in the edge area of the overlap part 20 along the width direction DR 2. Since a magnetic flux $\phi_B$ produced by the current I2 flowing in the conductive plate 21 slightly and relatively deny the magnetic flux $\phi_A$ produced by the current I1 flowing in the conductive plate 11, the effective inductance of the conductive plate 11 becomes slightly and relatively smaller than the self-inductance of the conductive plate 11 due to the mutual inductance between the conductive plate 11 and 21. The effective inductance of the conductive plate 12 becomes slightly and relatively smaller than the self-inductance of the conductive plate 12, as well.

As discussed above, where length L2 is not less than width W2 in the overlap part 20, the effective inductance of the conductive plates 11, 12 is significantly and relatively smaller than its self-inductance of the conductive plates 11, 12.

As a result, the total effective inductance L of the electric circuit device 100 is significantly and relatively reduced.

If a total effective capacitance of the electric circuit device 100 is C, the impedance Zs of the electric circuit device 100 is expressed by:

$$Z_S \doteq \sqrt{\frac{L}{C}} \quad \Lambda \tag{5}$$

The above-discussed electric circuit device 100 with four capacitors connected in parallel results in having larger effective capacitance C as compared with an electric circuit device with one capacitor.

Accordingly, the electric circuit device 100 can reduce its impedance Zs with an increase in the effective capacitance C in a low-frequency range dominated by capacitance, while the electric circuit device 100 can reduce its impedance Zs with a decrease in the effective inductance L in a high-frequency range dominated by inductance.

As a result, the electric circuit device 100 has relatively low impedance Zs for broadband frequencies.

Figure 11:
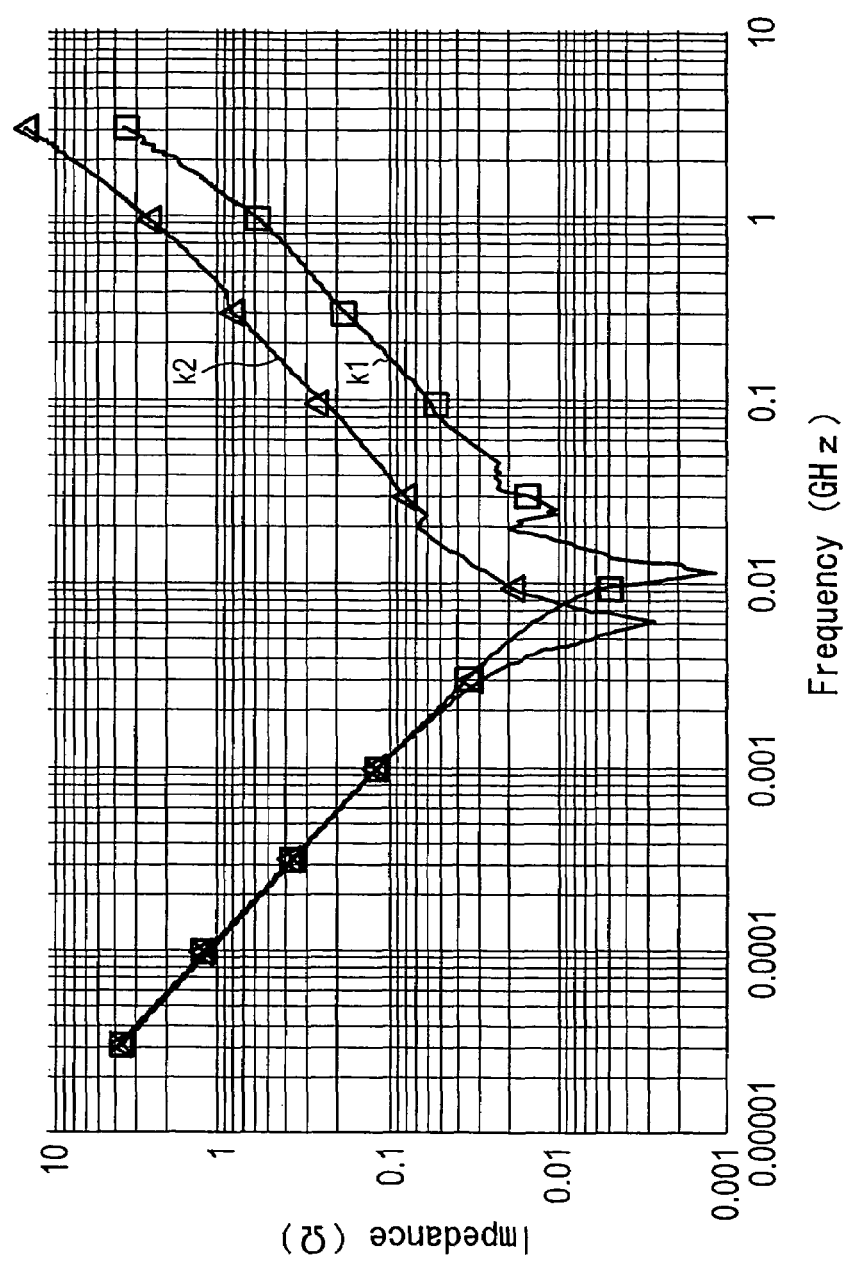
FIG. 11 is a view illustrating the frequency dependence of impedance in the electric circuit device shown in FIG. 1.

FIG. 11 is a view illustrating the frequency dependence of impedance in the electric circuit device 100 shown in FIG. 1. In FIG. 11, the horizontal axis indicates frequency, while the vertical axis indicates impedance. Curve k1 shows the frequency dependence of impedance in case when length L2 is not less than width W2 in the overlap part 20. Curve k2 shows the frequency dependence of impedance in case when length L2 is shorter than width W2 in the overlap part 20.

Referring to FIG. 11, a low-frequency range with not more than 0.006 GHz is frequency range dominated by capacitance, while a high-frequency range with not less than 0.01 GHz is frequency range dominated by inductance. As discussed above, the overlap part 20 with length L2 not less than width W2 and the overlap part 20 with length L2 shorter than width W2 have equal area. Therefore, in a low-frequency range with not more than 0.006 GHz dominated by capacitance, the impedance (curve k1) of the electric circuit device 100 of the overlap part 20 with length L2 not less than width W2 is almost same as the impedance (curve k2) of the electric circuit device of the overlap part 20 with length L2 shorter than width W2.

While, an inductance of the electric circuit device 100 of the overlap part 20 with length L2 not less than width W2 is significantly and relatively reduced as compared with the overlap part 20 with length L2 shorter than width W2. Therefore, in a high-frequency range with not less than 0.01 GHz dominated by inductance, the impedance (curve k1) of the electric circuit device 100 of the overlap part 20 with length L2 not less than width W2 is less than the impedance (curve k2) of the electric circuit device of the overlap part 20 with length L2 shorter than width W2.

Accordingly, the overlap part 20 between the conductive plates 11, 12 and the conductive plates 21 to 23, which is so set that length L2 is not less than width W2, can reduce the impedance of the electric circuit device 100 in frequency range dominated by inductance.

Figure 12:
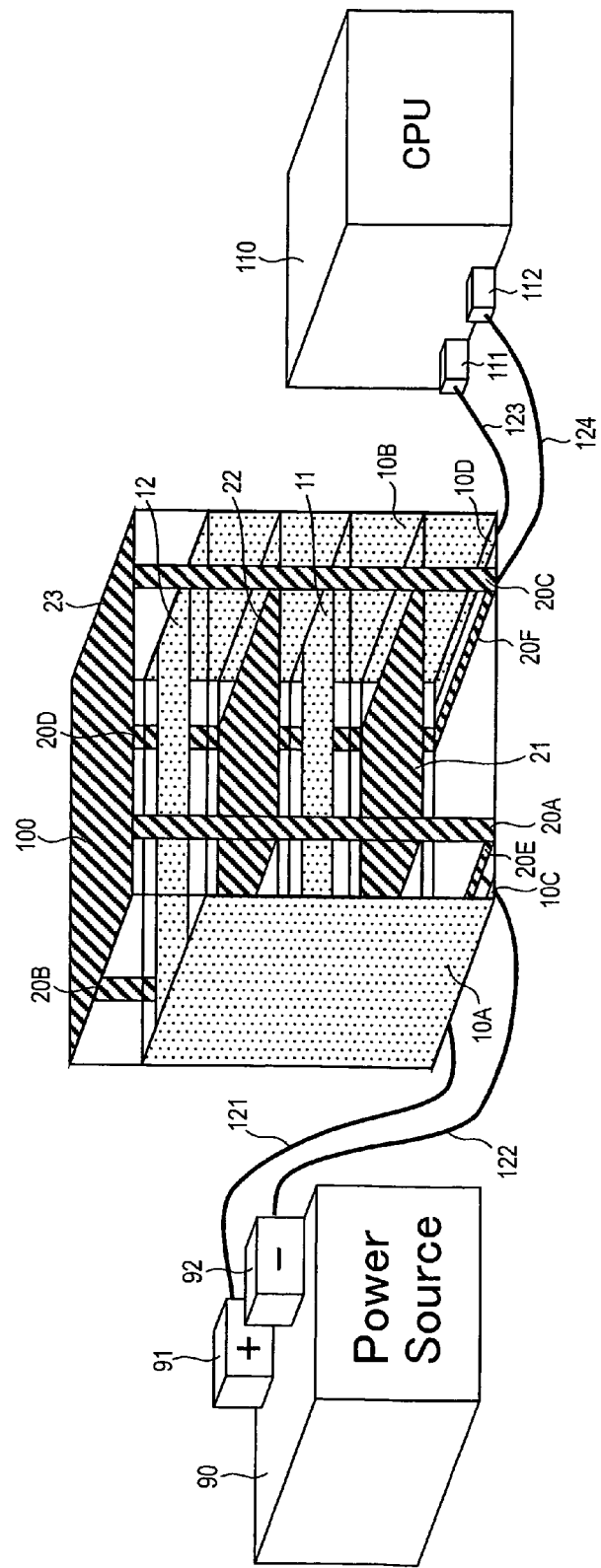
FIG. 12 is a conceptual illustration showing the electric circuit device shown in FIG. 1 in an operating state.

FIG. 12 is a conceptual illustration showing the electric circuit device 100 shown in FIG. 1 in an operating state. Referring to FIG. 12, the electric circuit device 100 is connected between a power source 90 and a CPU (Central Processing Unit) 110. The electric circuit device 100 has cathode electrodes 20E, 20F connected to ground potential. The power source 90 has a positive terminal 91 and a negative terminal 92. The CPU 110 has a positive terminal 111 and a negative terminal 112.

A lead wire 121 has one end connected to the positive terminal 91 of the power source 90 and the other end connected to the anode electrode 10C of the electric circuit device 100. A lead wire 122 has one end connected to the negative terminal 92 of the power source 90 and the other end connected to the cathode electrode 20E of the electric circuit device 100.

A lead wire 123 has one end connected to the anode electrode 10D of the electric circuit device 100 and the other end connected to the positive terminal 111 of the CPU 110. A lead wire 124 has one end connected to the cathode electrode 20F of the electric circuit device 100 and the other end connected to the negative terminal 112 of the CPU 110.

With this configuration, the current I output from the positive terminal 91 of the power source 90 passes through the lead wire 121 to the anode electrode 10C of the electric circuit device 100, and then passes the side anode electrode 10A, the conductive plates 11, 12, the side anode electrode 10B, and the anode electrode 10D in this order inside the electric circuit device 100. The current I then passes from the anode electrode 10D, through the lead wire 123 and the positive terminal 111, to the CPU 110.

This passage allows the current I to be supplied as a power source current to the CPU 110. The CPU 110 is driven with the current I and outputs a return current Ir, which has the same magnitude as the current I, from the negative terminal 112.

The return current Ir passes through the lead wire 124 to the cathode electrode 20F of the electric circuit device 100, and then passes the side cathode electrodes 20C, 20D, the conductive plates 21 to 23, the side cathode electrodes 20A, 20B, and the cathode electrode 20E in this order inside the electric circuit device 100. The return current Ir then passes from the cathode electrode 20E, through the lead wire 122 and negative terminal 92, to the power source 90.

As a result, the current I passing in the conductive plates 11, 12 from the power source 90 side to the CPU 110 side and the return current Ir passing in the conductive plates 21 to 23 from the CPU 110 side to the power source 90 side can significantly and relatively reduce the effective inductance L of the electric circuit device 100, as discussed above. The electric circuit device 100 with four capacitors connected in parallel results in having larger effective capacitance C of the electric circuit device 100, thereby reducing the impedance Zs of the electric circuit device 100.

The CPU 110 is driven with the current I supplied from the power source 90 through the electric circuit device 100, and produces an unwanted high-frequency current. This unwanted high-frequency current leaks through the lead wires 123, 124 out to the electric circuit device 100. However, the low impedance Zs of the electric circuit device 100 as discussed above causes the unwanted high-frequency current to flow within circuitry made up of the electric circuit device 100 and CPU 110, thereby preventing the leakage from the electric circuit device 100 toward the power source 90 side.

Under circumstances where the operating frequency of the CPU 110 tends to shift toward high frequencies, it could be assumed that the CPU 110 is operated at approximately 1 GHz. In such a high operating frequency range, the electric circuit device 100 functions as a noise filter for confining the unwanted high-frequency current, which is produced by the CPU 110 operating at the high operating frequency, within the vicinity of the CPU 110 under the condition that impedance Zs of the electric circuit device 100 is determined mainly by the effective inductance L and the effective inductance L is significantly and relatively reduced as discussed above.

In the first embodiment, length L2 and width W2 in the overlap part 20 are set so as to be L2≧W2. The value of L2/W2 is set relatively large as the operating frequency of the CPU 110 relatively rises, thereby significantly reducing the impedance of the electric circuit device 100 in the high-frequency range.

As discussed above, the electric circuit device 100 is connected between the power source 90 and the CPU 110, and functions as a noise filter for confining the unwanted high-frequency current produced by the CPU 110 within the vicinity of the CPU 110. When the electric circuit device 100 is connected between the power source 90 and the CPU 110, the conductive plates 11, 12, 21 to 23 are connected as transmission lines. In other words, the capacitor made up of the conductive plates 11, 12 connected to the anode electrodes 10C, 10D and the conductive plates 21 to 23 connected to the cathode electrodes 20E, 20F does not require terminals to be connected to the transmission line but using the conductive plates 11, 12, 21 to 23 as a part of the transmission lines. The conductive plates 11, 12, therefore, are conductors used for allowing the current I output from the power source 90 to flow from the power source 90 side to the CPU 110 side, while the conductive plates 21 to 23 are conductors used for allowing the return current Ir to flow from the CPU 110 side to the power source 90 side. Consequently, the equivalent series inductance can be reduced to a minimum.

In addition, the electric circuit device 100 is so configured that a current flowing in the conductive plates 11, 12 connected to the anode electrodes 10C, 10D is directed opposite to a current flowing in the conductive plates 21 to 23 connected to the cathode electrodes 20E, 20F, thereby creating magnetic interference between the conductive plates 11, 12 and conductive plates 21 to 23. Because of the magnetic interference, the mutual inductance between the conductive plates 11, 12 and conductive plates 21 to 23 reduces the self-inductance of the conductive plates 11, 12. The reduction of the self-inductance of the conductive plates 11, 12 reduces the effective inductance of the electric circuit device 100, thus lowering the impedance Zs of the electric circuit device 100.

The first characteristic feature of the present invention discussed above is that the conductive plates 11, 12, 21 to 23, which constitute electrodes of the capacitor, are connected as a part of the transmission lines. The second characteristic feature is that a current flowing in a direction opposite to the conductive plates 11, 12 connected to the anode electrodes 10C, 10D and the conductive plates 21 to 23 connected to the cathode electrodes 20E, 20F creates magnetic interference between the conductive plates 11, 12 and conductive plates 21 to 23, thereby making the effective inductance of the conductive plates 11, 12 smaller than the self-inductance of the conductive plates 11, 12, therefore lowering the impedance Zs of the electric circuit device 100. The third characteristic feature is that each of the conductive plates 11, 12 passing the current constituting a signal is sandwiched by two conductive plates (conductive plates 21, 22 or conductive plates 22, 23) connected to ground potential.

The second characteristic feature is realized by adopting the structure in which the return current Ir from the CPU 110 flows to the conductive plates 21 to 23 placed inside the electric circuit device 100.

The equivalent series inductance can be reduced to a minimum according to the first characteristic feature, and the unwanted high-frequency current can be confined in the vicinity of the CPU 110 according to the second characteristic feature. The third characteristic feature prevents noise generated by the electric circuit device 100 from leaking outside as well as preventing noise generated outside the electric circuit device 100 from affecting the electric circuit device 100.

Although all the dielectric layers 1 to 5 are composed of the same dielectric material (BaTiO3) in the above embodiment, the present invention is not limited to this. The dielectric layers 1 to 5 can be composed of different dielectric materials on an individual basis. Alternatively, the dielectric layers 1 to 5 can be put into two groups each composed of the same material, but the materials are different to each other. Typically the dielectric layers 1 to 5 may be composed of one or more kinds of dielectric materials. Any dielectric material for forming the dielectric layers 1 to 5 preferably has the relative permittivities of 3000 or more.

In addition to $BaTiO_3$, the dielectric layers may be composed of $Ba(Ti, Sn)O_3$, $Bi_4Ti_3O_{12}$, $(Ba, Sr, Ca)TiO_3$, $(Ba, Ca)(Zr, Ti)O_3$, $(Ba, Sr, Ca)(Zr, Ti)O_3$, $SrTiO_3$, $CaTiO_3$, $PbTiO_3$, $Pb(Zn, Nb)O_3$, $Pb(Fe, W)O_3$, $Pb(Fe, Nb)O_3$, $Pb(Mg, Nb)O_3$, $Pb(Ni, W)O_3$, $Pb(Mg, W)O_3$, $Pb(Zr, Ti)O_3$, $Pb(Li, Fe, W)O_3$, $Pb_5Ge_3O_{11}$ and $CaZrO_3$, and so forth.

Although the anode electrodes 10C, 10D, side anode electrodes 10A, 10B, conductive plates 11, 12, 21 to 23, side cathode electrodes 20A, 20B, 20C, 20D and cathode electrodes 20E, 20F are composed of nickel (Ni) in the above embodiment, the present invention is not limited to this. The anode electrodes 10C, 10D, side anode electrodes 10A, 10B, conductive plates 11, 12, 21 to 23, side cathode electrodes 20A, 20B, 20C, 20D and cathode electrodes 20E, 20F can be composed of any of silver (Ag), palladium (Pd), silver-palladium alloy (Ag—Pd), platinum (Pt), gold (Au), copper (Cu), rubidium (Ru) and tungsten (W).

Although the electric circuit device 100 comprises the dielectric layers 1 to 5 in the above embodiment, the present invention is not limited to this. The electric circuit device 100 does not need to comprise the dielectric layers 1 to 5. Since magnetic interference could occur between the conductive plates 11, 12 and conductive plates 21 to 23 even without the dielectric layers 1 to 5, the aforementioned mechanism can reduce the impedance of the electric circuit device 100.

Although the number of the conductive plates to be connected to the anode electrodes 10C, 10D is two (i.e. conductive plates 11, 12), while the number of the conductive plates to be connected to the cathode electrodes 20E, 20F is three (i.e. conductive plates 21 to 23) in the above embodiment, the present invention is not limited to this. The electric circuit device 100 can comprise n-number (n is a positive integer) of the conductive plates connected to the anode electrodes 10C, 10D and m-number (m is a positive integer) of the conductive plates connected to the cathode electrodes 20E, 20F. In this case, the electric circuit device 100 comprises j-number (j=m+n) of the dielectric layers. The magnetic interference to make the effective inductance small can be generated as long as there are at least one conductive plate connected to the anode electrodes 10C, 10D and at least one conductive plate connected to the cathode electrodes 20E, 20F.

In the present invention, the number of the conductive plates connected to the anode electrodes 10C, 10D and the number of the conductive plates connected to the cathode electrodes 20E, 20F are increased with an increase of the electric current flowing in the electric circuit device 100. Since the conductive plates connected to the anode electrodes 10C, 10D and the conductive plates connected to the cathode electrodes 20E, 20F are connected between two anode electrodes (i.e. 10C and 10D), or between two cathode electrodes (i.e. 20E and 20F) in parallel, the addition of the conductive plates connected to the anode electrodes 10C, 10D and the conductive plates connected to the cathode electrodes 20E, 20F can increase the amount of electric current flowing in the electric circuit device 100.

In order to relatively reduce impedance of the electric circuit device 100, the number of the conductive plates connected to the anode electrodes 10C, 10D and the number of the conductive plates connected to the cathode electrodes 20E, 20F are increased in the present invention. Because the addition of the conductive plates connected to the anode electrodes 10C, 10D and the conductive plates connected to the cathode electrodes 20E, 20F provides additional capacitors to be connected in parallel, thereby increasing the effective capacitance of the electric circuit device 100, therefore lowering the impedance.

Although the conductive plates 11, 12 are placed parallel with the conductive plates 21 to 23 in the above embodiment, the present invention is not limited to this. The conductive plates 11, 12, 21 to 23 can be placed so that the distance between the conductive plates 11, 12 and the conductive plates 21 to 23 varies along the longitudinal direction DR1.

Although the electric circuit device 100 is connected to the CPU 110 in the above embodiment, the present invention is not limited to this. The electric circuit device 100 can be connected to electrical load circuit in any way as long as the electrical load circuit operates at a predetermined frequency.

Although the electric circuit device 100 is used as a noise filter for confining the unwanted high-frequency current produced by the CPU 110 within the vicinity of the CPU 110 in the above embodiment, the present invention is not limited to this. The electric circuit device 100 can be used as a capacitor. Since the electric circuit device 100 includes four capacitors connected in parallel as discussed above, the electric circuit device 100 also can be used as a capacitor.

More concretely, the electric circuit device 100 can be used in notebook computers, CD-RW/DVD recorders and players, game machines, information appliances, digital cameras, in-vehicle electric equipment, in-vehicle digital equipment, MPU peripheral circuitry and DC/DC converters and so forth.

Electric circuit device that are adopted in notebook computers and CD-RW/DVD recorders and players as a capacitor, but function as a noise filter, arranged between the power source 90 and the CPU 110, for confining the unwanted high-frequency current produced by the CPU 110 within the vicinity of the CPU 110 are grouped with the electric circuit device 100 of the present invention.

The Second Embodiment

Figure 13:
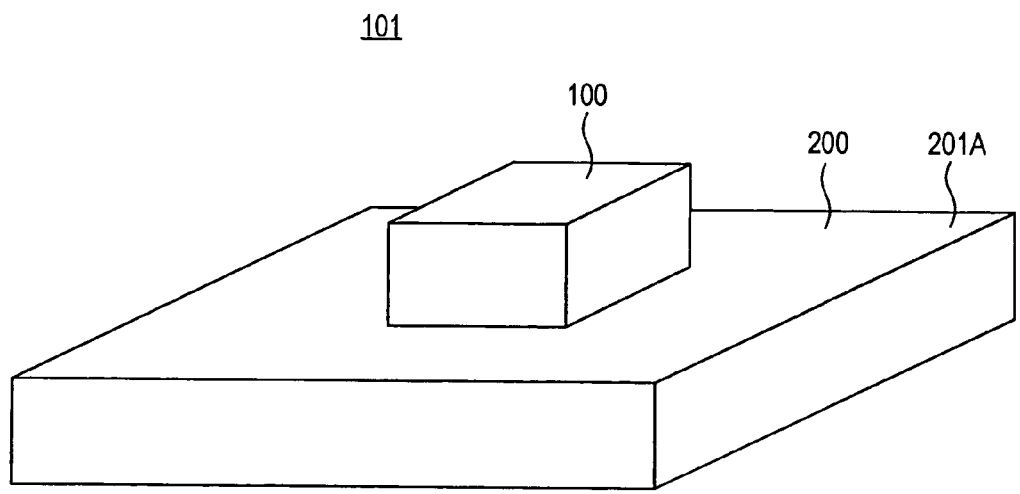
FIG. 13 is a conceptual illustration showing the structure of the electric circuit device according to the second embodiment.

FIG. 13 is a conceptual illustration showing the structure of the electric circuit device according to the second embodiment. Referring to FIG. 13, an electric circuit device 101 of the second embodiment includes a substrate 200 and the same components as those of the electric circuit device 100 shown in FIG. 1.

In the electric circuit device 101, the electric circuit device 100 is arranged on a principal surface 201A of the substrate 200.

Figure 14:
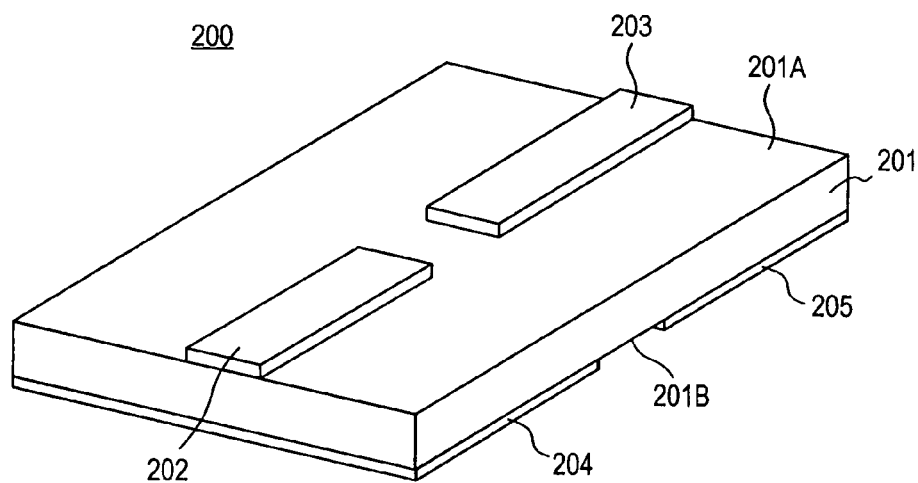
FIG. 14 is a perspective view showing the structure of a substrate shown in FIG. 13.

FIG. 14 is a perspective view showing the structure of the substrate 200 shown in FIG. 13. The substrate 200 includes a dielectric 201, signal wires 202, 203, and conductive plates 204, 205.

The signal wires 202, 203 are placed on the principal surface 201A of the dielectric 201 at predefined distance, while the conductive plates 204, 205 are placed on a principal surface 201B opposite to the principal surface 201A of the dielectric 201 at predefined space. The substrate 200 thus comprises microstrip line substrate which has the signal wires 202, 203 placed on one principal surface 201A and the conductive plates 204, 205 disposed on the other principal surface 201B.

When the substrate 200 is used in the electric circuit device 101, the conductive plates 204, 205 are connected to ground.

FIG. 15 is a perspective view for fully describing the electric circuit device 101 shown in FIG. 13. Referring to FIG. 15, the dielectric layers 1 to 5, conductive plates 11, 12, 21 to 23, side anode electrodes 10A, 10B, anode electrodes 10C, 10D, side cathode electrodes 20A, 20B, 20C, 20D, and cathode electrodes 20E, 20F are arranged on the principal surface 201A of the dielectric 201 in the substrate 200. The dielectric layers 1 to 5, conductive plates 11, 12, 21 to 23, side anode electrodes 10A, 10B, anode electrodes 10C, 10D, side cathode electrodes 20A, 20B, 20C, 20D, and cathode electrodes 20E, 20F constitute "an electric element" in the second embodiment.

The side anode electrode 10A and anode electrode 10C are connected to the signal wire 202, while the side anode electrode 10B and anode electrode 10D are connected to the signal wire 203. A conductor 206 connects the side cathode electrode 20A and cathode electrode 20E to the conductive plate 204, while a conductor 207 connects the side cathode electrode 20C and cathode electrode 20F to the conductive plate 205. As not shown in FIG. 15, a conductor (not shown) connects the side cathode electrode 20B to the conductive plate 204, while the conductor (not shown) connects the side cathode electrode 20D to the conductive plate 205.

The conductive plates 204, 205 pass the return current Ir when the current I is flowing in the conductive plates 11, 12. The return current Ir passes from the conductive plate 205, through the conductive plate 207 and the conductor (not shown), to the side cathode electrodes 20C, 20D, and then passes through the conductive plates 21 to 23 to the side cathode electrodes 20A, 20B.

The return current Ir which passes to the side cathode electrodes 20A, 20B passes through the conductive plate 206 and the conductor (not shown) to the conductive plate 204, and then passes from the conductive plate 204 to the outside of the electric circuit device 101.

As discussed above, the substrate 200 comprises the conductive plates 204, 205 leading the return current Ir to the conductive plates 21 to 23 inside the electric circuit device 101.

Figure 16A:
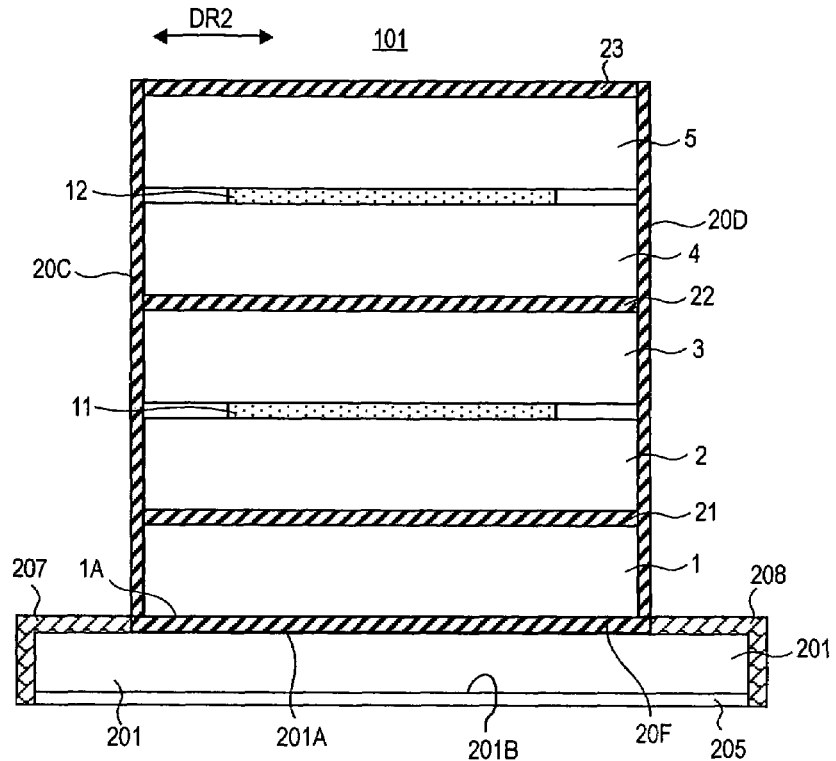
FIGS. 16A and 16B are cross-sectional views of the electric circuit device shown in FIG. 15.
Figure 16B:
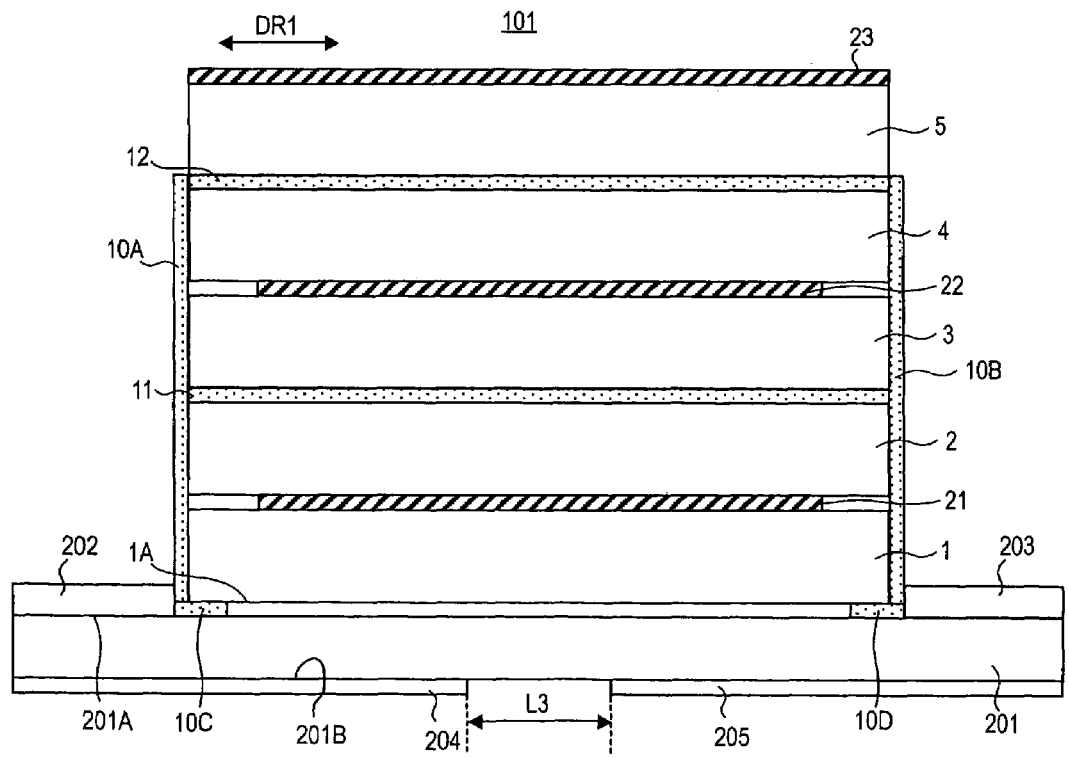

FIGS. 16A and 16B are cross-sectional views of the electric circuit device 101 shown in FIG. 15. FIG. 16A is a cross-sectional view of the electric circuit device 101 as taken along line XVIA-XVIA of FIG. 15, while FIG. 16B is a cross-sectional view of the electric circuit device 101 as taken along line XVIB-XVIB of FIG. 15.

Referring to FIG. 16A, the cathode electrode 20F is disposed on the principal surface 201A of the dielectric 201, and the conductive plate 205 is placed on the principal surface 201B of the dielectric 201 over the entire width of the dielectric 201. The conductor 207 connects the conductive plate 205 to the side cathode electrode 20C and cathode electrode 20F, while the conductor 208 connects the conductive plate 205 to the side cathode electrode 20D and cathode electrode 20F.

The conductive plate 204 is connected to the side cathode electrodes 20A, 20B and cathode electrode 20E by the same method as the conductive plate 205.

Referring to FIG. 16B, the signal wire 202 is connected to the side anode electrode 10A and anode electrode 10C, while the signal wire 203 is connected to the side anode electrode 10B and anode electrode 10D.

The conductive plate 204 is placed on the principal surface 201B at the predefined distance L3 away from the conductive plate 205. Basically, the predefined distance L3 is so set that the return current Ir with the predefined frequency does not pass between the conductive plate 204 and the conductive plate 205.

As discussed above, the conductive plates 204, 205 placed on the principal surface 201B of the dielectric 201 at the predefined distance L3 can lead the return current Ir to the conductive plates 21 to 23 inside the electric circuit device 101, without passing the return current Ir between the conductive plates 204 and 205.

The configuration results in a relatively increasing magnetic coupling between the conductive plates 11, 12 and the conductive plates 21 to 23 and a significantly lower effective inductance of the conductive plates 11, 12 than the self-inductance of the conductive plates 11, 12 according to the aforementioned mechanism of the first embodiment.

Figure 17:
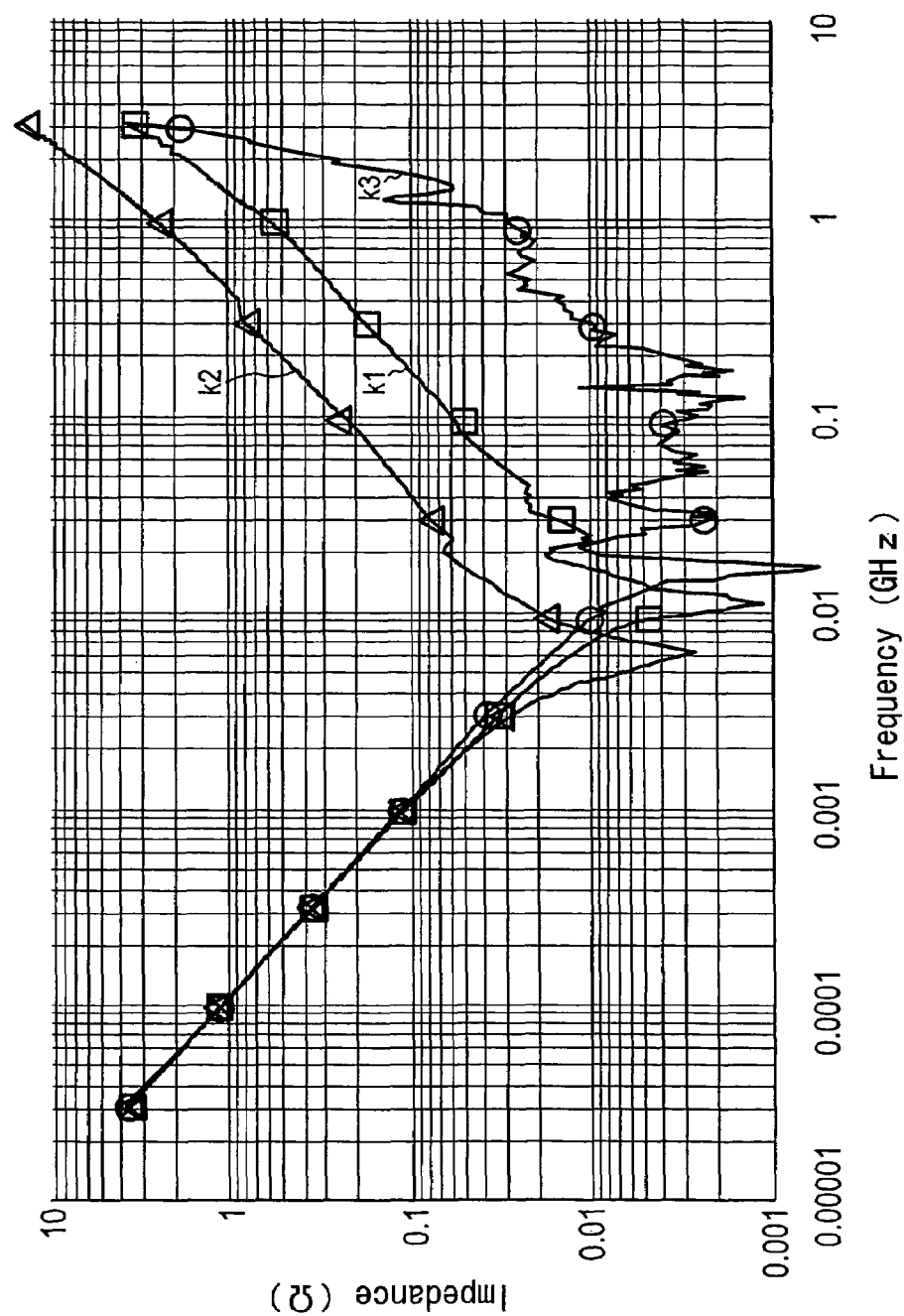
FIG. 17 is a view illustrating the frequency dependence of impedance in the electric circuit device shown in FIG. 15.

FIG. 17 is a view illustrating the frequency dependence of impedance in the electric circuit device 101 shown in FIG. 15. In FIG. 17, the vertical axis indicates impedance, while the horizontal axis indicates frequency. Curve k3 shows the frequency dependence of impedance in the electric circuit device 101

Referring to FIG. 17, an impedance of the electric circuit device 101 is almost same as that of the electric circuit device 100 according to the first embodiment in a low-frequency range with not more than 0.006 GHz dominated by capacitance (see curves k1, k3).

In a high-frequency range with not less than 0.01 GHz dominated by inductance, the impedance of the electric circuit device 101 is significantly reduced than that of the electric circuit device 100 according to the first embodiment (see curves k1, k3).

Accordingly, the substrate 200 including the two conductive plates 204, 205 placed at the predefined distance L3 can lead the return current Ir to the conductive plates 21 to 23 inside the electric circuit device 101, and can significantly lower the effective inductance of the conductive plates 11, 12 than the self-inductance of the conductive plates 11, 12, thereby significantly lowering the impedance of the electric circuit device 101 in a high-frequency range dominated by inductance.

Figure 18:
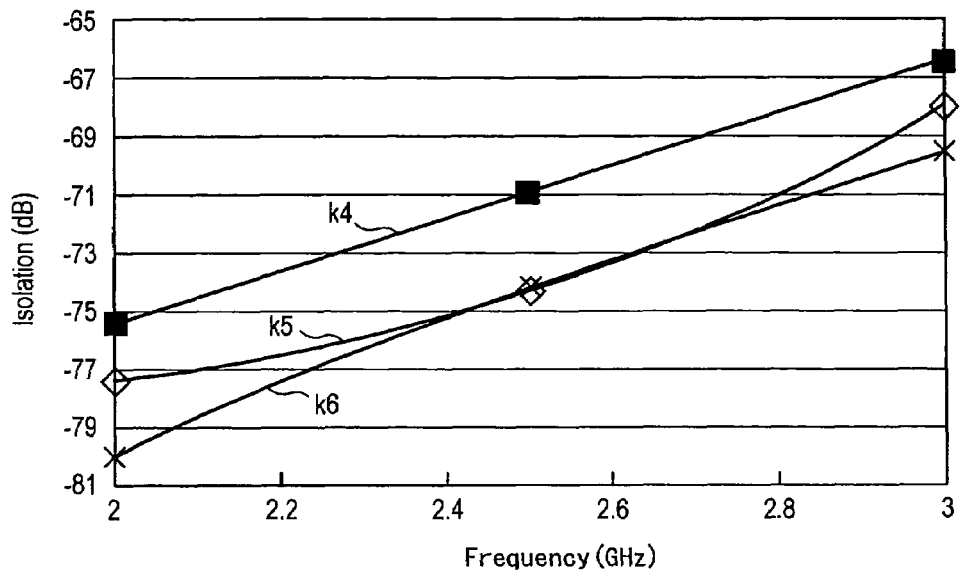
FIG. 18 is a view illustrating the relation of frequency and degree of electric separation between the two conductive plates shown in FIG. 15.

FIG. 18 is a view illustrating the relation of frequency and degree of electric separation between the two conductive plates 204 and 205 shown in FIG. 15. In FIG. 18, the vertical axis indicates Isolation, while the horizontal axis indicates frequency. The lower Isolation value means higher degree of electric separation. Curves k4, k5, k6 show relationship in case when the predefined distance L3 is 1.5 mm, 3.0 mm, and 4.5 mm, respectively.

By increasing the predefined distance L3 from 1.5 mm to 3.0 mm, with reference to FIG. 18, the Isolation between the conductive plates 204 and 205 becomes lower in a frequency range of 2 to 3 GHz, while the degree of electric separation between the conductive plates 204 and 205 becomes higher. On the other hand, even by increasing the predefined distance L3 from 3.0 mm to 4.5 mm, the Isolation between the conductive plates 204 and 205 is little changed in a frequency range of 2 to 3 GHz. Therefore, the predefined distance L3 is preferably set at not less than 3.0 mm.

Figure 19:
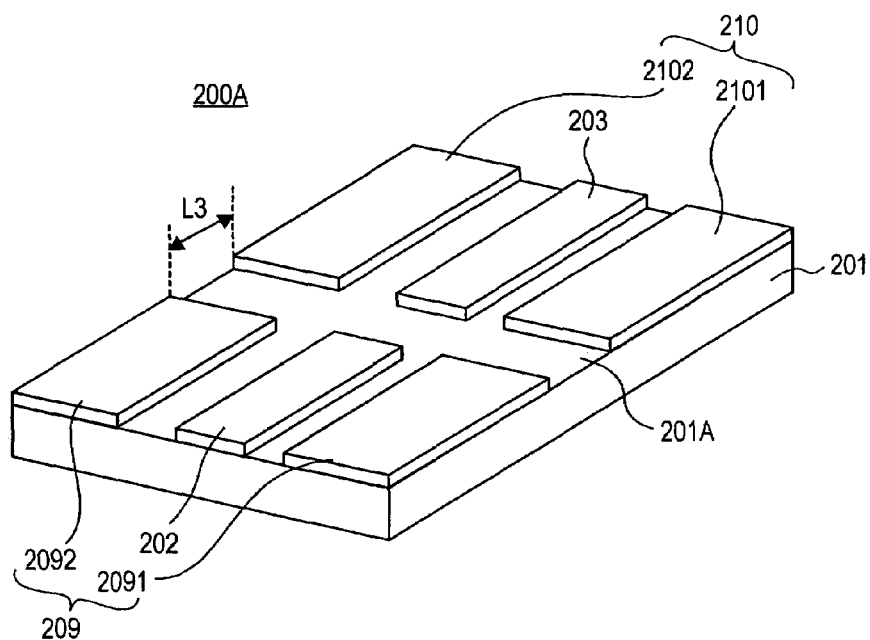
FIG. 19 is another perspective view showing the structure of the substrate shown in FIG. 13.

FIG. 19 is another perspective view showing the structure of the substrate 200 shown in FIG. 13. The substrate 200 shown in FIG. 13 can be replaced with a substrate 200A shown in FIG. 19. Referring to FIG. 19, the substrate 200A includes conductive plates 209, 210 instead of the conductive plates 204, 205, respectively and the same components as those of the substrate 200 shown in FIG. 14.

The conductive plate 209 is placed on the principal surface 201A of the dielectric 201 and comprises flat plate members 2091, 2092. The flat plate members 2091, 2092 are disposed on both sides of the signal wire 202 on the principal surface 201A of the dielectric 201.

The conductive plate 210 is placed on the principal surface 201A of the dielectric 201 and comprises flat plate members 2101, 2102. The flat plate members 2101, 2102 are disposed on both sides of the signal wire 203 on the principal surface 201A of the dielectric 201. The distances between the flat plate member 2091 and the flat plate member 2101 and between the flat plate member 2092 and the flat plate member 2102 are set at the predefined distance L3.

In the above-discussed substrate 200A, the conductive plates 209, 210 are displaced on the principal surface 201A, where the signal wires 202, 203 are disposed, at the predefined distance L3. The conductive plates 209, 210 comprise the flat plate members 2091, 2092 and the flat plate members 2101, 2102, respectively disposed on both sides of the signal wires 202, 203. Therefore, the substrate 200A is composed of a coplanar substrate.

When the substrate 200A is used in the electric circuit device 101, a conductor (not shown) connects the flat plate member 2091 of the conductive plate 209 to the side cathode electrode 20A and cathode electrode 20E, while the conductor (not shown) connects the flat plate member 2092 of the conductive plate 209 to the side cathode electrode 20B and cathode electrode 20E. The conductor (not shown) connects the flat plate member 2101 of the conductive plate 210 to the side cathode electrode 20C and cathode electrode 20F, while the conductor (not shown) connects the flat plate member 2102 of the conductive plate 210 to the side cathode electrode 20D and cathode electrode 20F. The conductive plates 209, 210 are thus connected to ground.

Since the substrate 200A comprises the two conductive plates 209, 210 which are disposed at the defined distance L3, the substrate 200A used in the electric circuit device 101 can significantly reduce the impedance of the electric circuit device 101 in the high-frequency range dominated by inductance, as well as the substrate 200 used in the electric circuit device 101.

Figure 20:
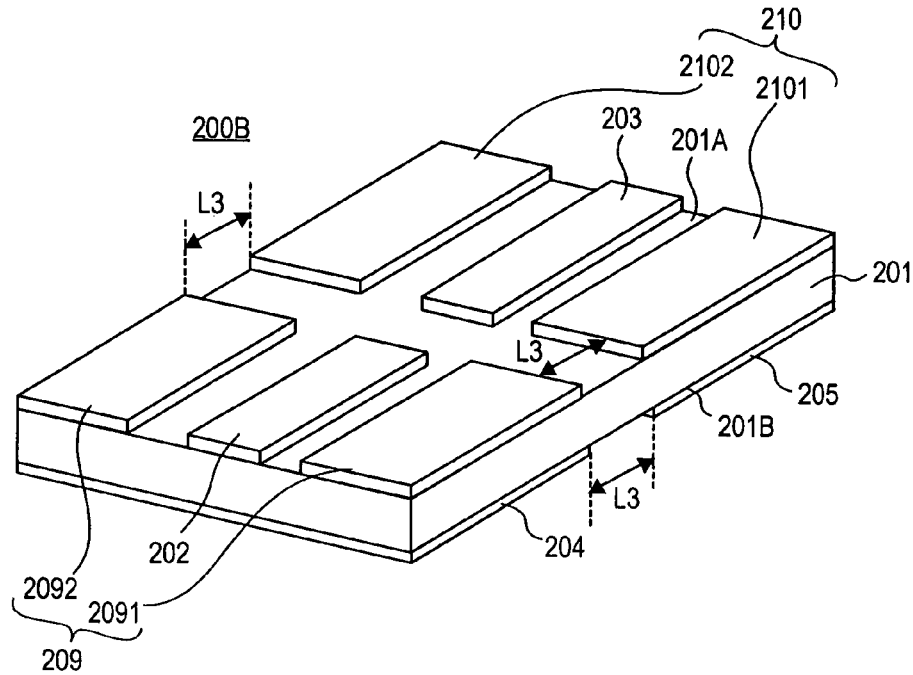
FIG. 20 is further another perspective view showing the structure of the substrate shown in FIG. 13.

FIG. 20 is further another perspective view showing the structure of the substrate 200 shown in FIG. 13. The substrate 200 shown in FIG. 13 can be replaced with a substrate 200B shown in FIG. 20. Referring to FIG. 20, the substrate 200B includes conductive plates 209, 210 and the same components as those of the substrate 200 shown in FIG. 14. The conductive plates 209, 210 are as explained in FIG. 19.

Accordingly, the substrate 200B comprises the conductive plates 209, 210 placed on the principal surface 201A, where the signal wires 202, 203 are placed, at the predefined distance L3 and the conductive plates 204, 205 placed on the principal surface 201B opposite to the principal surface 201A, where the signal wires 202, 203 are placed, at the predefined distance L3. When the substrate 200B is used in the electric circuit device 101, the conductive plates 204, 205, 209, 210 are connected to ground. The substrate 200B with this configuration is named coplanar substrate with rear ground.

When the substrate 200B is used in the electric circuit device 101, the conductor (not shown) connects the flat plate member 2091 of the conductive plate 209 and the conductive plate 204 to the side cathode electrode 20A and cathode electrode 20E, while the conductor (not shown) connects the flat plate member 2092 of the conductive plate 209 and the conductive plate 204 to the side cathode electrode 20B and cathode electrode 20E. The conductor (not shown) connects the flat plate member 2101 of the conductive plate 210 and the conductive plat 205 to the side cathode electrode 20C and cathode electrode 20F, while the conductor (not shown) connects the flat plate member 2102 of the conductive plate 210 and the conductive plate 205 to the side cathode electrode 20D and cathode electrode 20F. The conductive plates 204, 205, 209, 210 are thus connected to ground.

Since the substrate 200B comprises the two conductive plates 204, 205 and the two conductive plates 209, 210 which are both disposed at the predefined distance L3, the substrate 200B used in the electric circuit device 101 can significantly reduce the impedance of the electric circuit device 101 in the high-frequency range dominated by inductance as well as the substrate 200 used in the electric circuit device 101.

Figure 21:
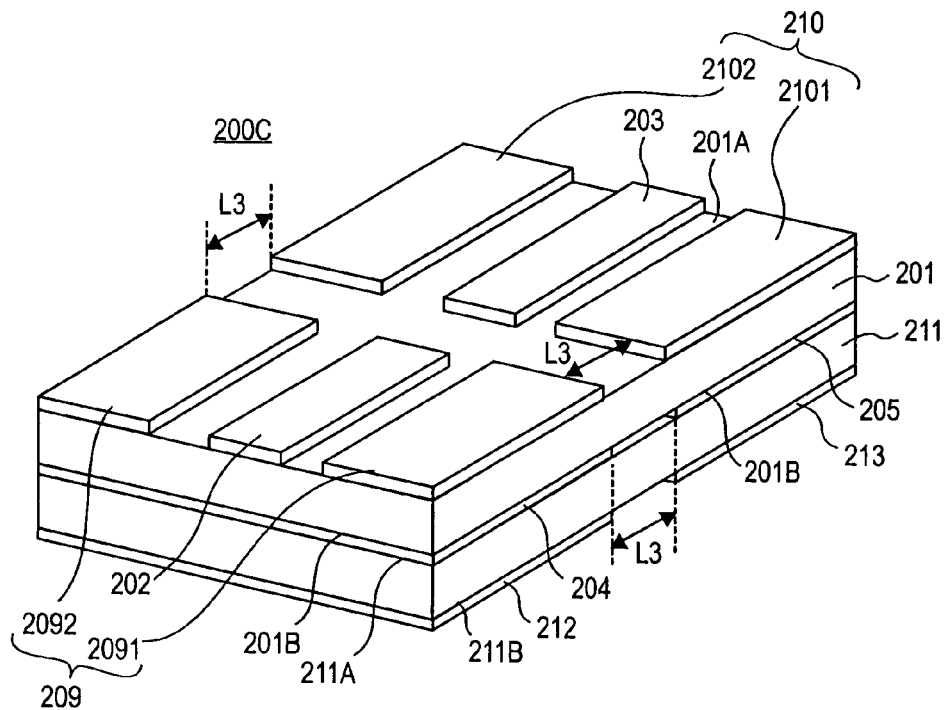
FIG. 21 is further another perspective view showing the structure of the substrate shown in FIG. 13.

FIG. 21 is further another perspective view showing the structure of the substrate 200 shown in FIG. 13. The substrate 200 shown in FIG. 13 can be replaced with a substrate 200C shown in FIG. 21. Referring to FIG. 21, the substrate 200C includes a dielectric 211, conductive plates 212, 213, and the same components as those of the substrate 200B shown in FIG. 20.

The dielectric 211 is so disposed that its principal surface 211A is abutted on the conductive plates 204, 205. The conductive plates 212, 213 are placed on a principal surface 211B opposite to the principal surface 211A of the dielectric 211 at the predefined distance L3.

Accordingly, the substrate 200C includes a plurality of dielectrics 201, 211 which are stacked and the conductive plates 204, 205, 209, 210, 212, 213 which are placed on the front face and rear face of each dielectrics 201, 211 at the predefined distance L3. The substrate 200C with this configuration is named multilayer substrate.

When the substrate 200C is used in the electric circuit device 101, the conductor (not shown) connects the flat plate member 2091 of the conductive plate 209 and the conductive plates 204, 212 to the side cathode electrode 20A and cathode electrode 20E, while the conductor (not shown) connects the flat plate member 2092 of the conductive plate 209 and the conductive plates 204, 212 to the side cathode electrode 20B and cathode electrode 20E. The conductor (not shown) connects the flat plate member 2101 of the conductive plate 210 and the conductive plats 205, 213 to the side cathode electrode 20C and cathode electrode 20F, while the conductor (not shown) connects the flat plate member 2102 of the conductive plate 210 and the conductive plates 205, 215 to the side cathode electrode 20D and cathode electrode 20F. The conductive plates 204, 205, 209, 210, 212, 213 are thus connected to ground.

Since the substrate 200C comprises the two conductive plates 204, 205, the two conductive plates 209, 210, and the two conductive plates 212, 213 which are all disposed at the predefined distance L3, the substrate 200C used in the electric circuit device 101 can significantly reduce the impedance of the electric circuit device 101 in the high-frequency range dominated by inductance as well as the substrate 200 used in the electric circuit device 101.

Although the substrate 200C includes the two dielectrics 201, 211 in the above embodiment, the present invention is not limited to this. The substrate 200C can comprise not less than three dielectrics, and generally may comprise a plurality of dielectrics.

The above-discussed substrates 200, 200A, 200B, 200C can reduce the impedance of the electric element (comprising dielectric layers 1 to 5, conductive plates 11, 12, 21 to 23, side anode electrodes 10A, 10B, anode electrodes 10C, 10D, side cathode electrodes 20A, 20B, 20C, 20D, and cathode electrodes 20E, 20F) in the high-frequency range dominated by inductance, while constituting the substrate of the present invention.

Figure 22:
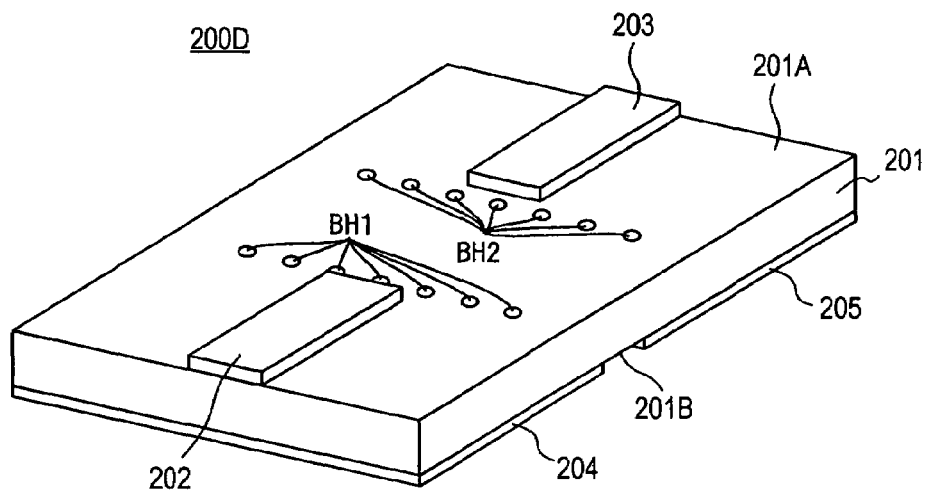
FIG. 22 is further another perspective view showing the structure of the substrate shown in FIG. 13.

FIG. 22 is further another perspective view showing the structure of the substrate 200 shown in FIG. 13. The substrate 200 shown in FIG. 13 can be replaced with a substrate 200D shown in FIG. 22. Referring to FIG. 22, the substrate 200D includes via holes BH1, BH2 and the same components as those of the substrate 200 shown in FIG. 14.

The via hole BH1 is arranged on the signal wire 202 side and is connected to the conductive plate 204 through the dielectric 201, while the via hole BH2 is arranged on the signal wire 203 side and is connected to the conductive plate 205 through the dielectric 201.

When the substrate 200D is used in the electric circuit device 101, the signal wire 202 is connected to the side anode electrode 10A, the signal wire 203 is connected to the side anode electrode 10B, the via hole BH1 is connected to the cathode electrode 20E, and the via hole BH2 is connected to the cathode electrode 20F.

As discussed above, when the substrate 200D is used in the electric circuit device 101, the cathode electrodes 20E, 20F are respectively connected through the via holes BH1, BH2 to the conductive plates 204, 205 connected to the ground. This configuration allows the return current Ir to pass in the conductive plate 205, via hole BH2, cathode electrode 20F, side cathode electrodes 20C, 20D, conductive plates 21, 22, side cathode electrodes 20A, 20B, cathode electrode 20E, via hole BH1, and conductive plate 204 in this order, thereby more reducing the effective inductance of the conductive plates 11, 12 than the self-inductance of the conductive plates 11, 12.

Figure 23:
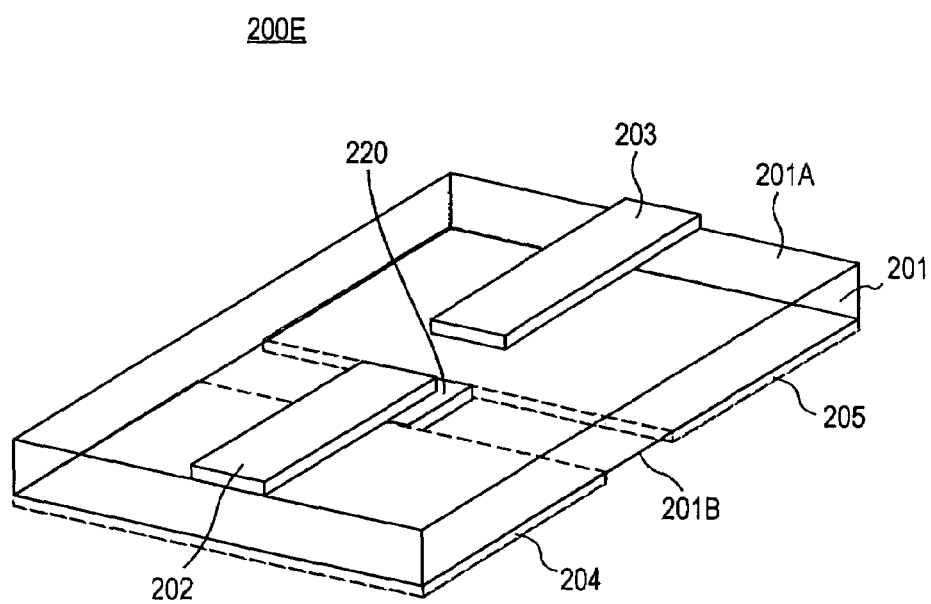
FIG. 23 is further another perspective view showing the structure of the substrate shown in FIG. 13.

FIG. 23 is further another perspective view showing the structure of the substrate 200 shown in FIG. 13. The substrate 200 shown in FIG. 13 can be replaced with a substrate 200E shown in FIG. 23. Referring to FIG. 23, the substrate 200E includes a current control unit 220 and the same components as those of the substrate 200 shown in FIG. 14.

The current control unit 220 is composed of, for example, impedance and has one end connected to the conductive plate 204 and the other end connected to the conductive plate 205. Of the return current Ir, a current Ir1 passes in the conductive plates 21 to 23 in the electric circuit device 101 and a current Ir2 passes from the conductive plate 205, through the current control unit 220, to the conductive plate 204. In this configuration, the current control unit 220 lowers the current Ir2 than the current Ir1.

As a result, the return current Ir mainly passes through the conductive plates 21 to 23 to the electric circuit device 101, thereby lowering the effective inductance of the conductive plates 11, 12 than the self-inductance of the conductive plates 11, 12.

When the substrate 200E is used in the electric circuit device 101, the conductor (not shown) connects the conductive plate 204 to the side cathode electrodes 20A, 20B and cathode electrode 20E, while the conductor (not shown) connects the conductive plate 205 to the side cathode electrodes 20C, 20D and cathode electrode 20F. The conductive plates 204, 205 are thus connected to the ground.

Since the substrate 200E comprises the two conductive plates 204, 205 which are disposed at the predefined distance L3 and the current control unit 220 which more controls the current Ir2 passing between the conductive plates 204 and 205 than the current Ir1 passing in the conductive plates 21 to 23, the substrate 200D used in the electric circuit device 101 can significantly reduce the impedance of the electric circuit device 101 in the high-frequency range dominated by inductance as well as the substrate 200 used in the electric circuit device 101.

The substrate 200 shown in FIG. 13 may comprise a substrate including the current control unit 220 between the flat plate members 2091 and 2101 and between the flat plate members 2092 and 2102 of the substrate 200A shown in FIG. 19, a substrate including the current control unit 220 between the conductive plates 204 and 205, between the flat plate members 2091 and 2101, and between the flat plate members 2092 and 2102 of the substrate 200B shown in FIG. 20, a substrate including the current control unit 220 between the conductive plates 204 and 205, between the flat plate members 2091 and 2101, between the flat plate members 2092 and 2102, and the conductive plates 212 and 213 of the substrate 200C shown in FIG. 21, and a substrate including the current control unit 220 between the conductive plates 204 and 205 of the substrate 200D shown in FIG. 22. Even these substrates can significantly reduce the impedance of the electric circuit device 101 in the high-frequency range dominated by inductance.

The above-discussed electric circuit device 101 is disposed between the power source 90 and the CPU 110 and confines a noise produced by the CPU 110 within the vicinity of the CPU 110 (see FIG. 12) as well as the electric circuit device 100.

According to the second embodiment, the electric circuit device 101 comprises the substrates 200, 200D (substrates 200A, 200B, 200C) including the conductive plates 204, 205 (conductive plates 209, 210, 212, 213) which are disposed at the predefined distance L3 and pass the return current Ir in the conductive plates 21 to 23. Therefore, the afore-mentioned electric circuit device 101 can more reduce the impedance of the electric circuit device 101 than the electric circuit device 101 without comprising the substrates 200, 200D (substrates 200A, 200B, 200C) in the high-frequency range dominated by inductance.

According to the second embodiment, the electric circuit device 101 comprises the substrate 200E including the conductive plates 204, 205, which mainly pass the return current Ir in the conductive plates 21 to 23, and the current control unit 220. Therefore, the afore-mentioned electric circuit device 101 can more reduce the impedance of the electric circuit device 101 than the electric circuit device 101 without comprising the substrate 200E in the high-frequency range dominated by inductance.

As to the other structure, the second embodiment is the same as the first embodiment.

In the second embodiment, the conductive plates 204, 205 constitute "a third conductive plate". The conductive plate 204 constitutes "a first flat plate member", while the conductive plate 205 constitutes "a second flat plate member".

In the substrates 200, 200D, the conductive plate 204 constitutes "a third conductive plate", while the conductive plate 205 constitutes "a fourth conductive plate".

In the substrate 200A, the flat plate members 2091, 2092 constitute "a first flat plate member" and "a second flat plate member", respectively. The flat plate members 2101, 2102 constitute "a third flat plate member" and "a fourth flat plate member", respectively.

In the substrate 200B, the flat plate members 2091, 2092 constitute "a first flat plate member" and "a second flat plate member", respectively, and the conductive plate 204 constitutes "a third flat plate member". The flat plate members 2101, 2102 constitute "a fourth flat plate member" and "a fifth flat plate member", respectively, and the conductive plate 205 constitutes "a sixth flat plate member".

In the substrate 200C, the dielectrics 201, 211 constitute "a plurality of dielectrics". The conductive plates 204, 209, 212 constitute "a third conductive plate" and "a plurality of first flat plate member", while the conductive plates 205, 210, 213 constitute "a fourth conductive plate" and "a plurality of second flat plate member". The flat plate members 2091, 2092 constitute "a first flat plate part" and "a second flat plate part", respectively, while the flat plate members 2101, 2102 constitute "a third flat plate part" and "a fourth flat plate part", respectively.

The Third Embodiment

Figure 24:
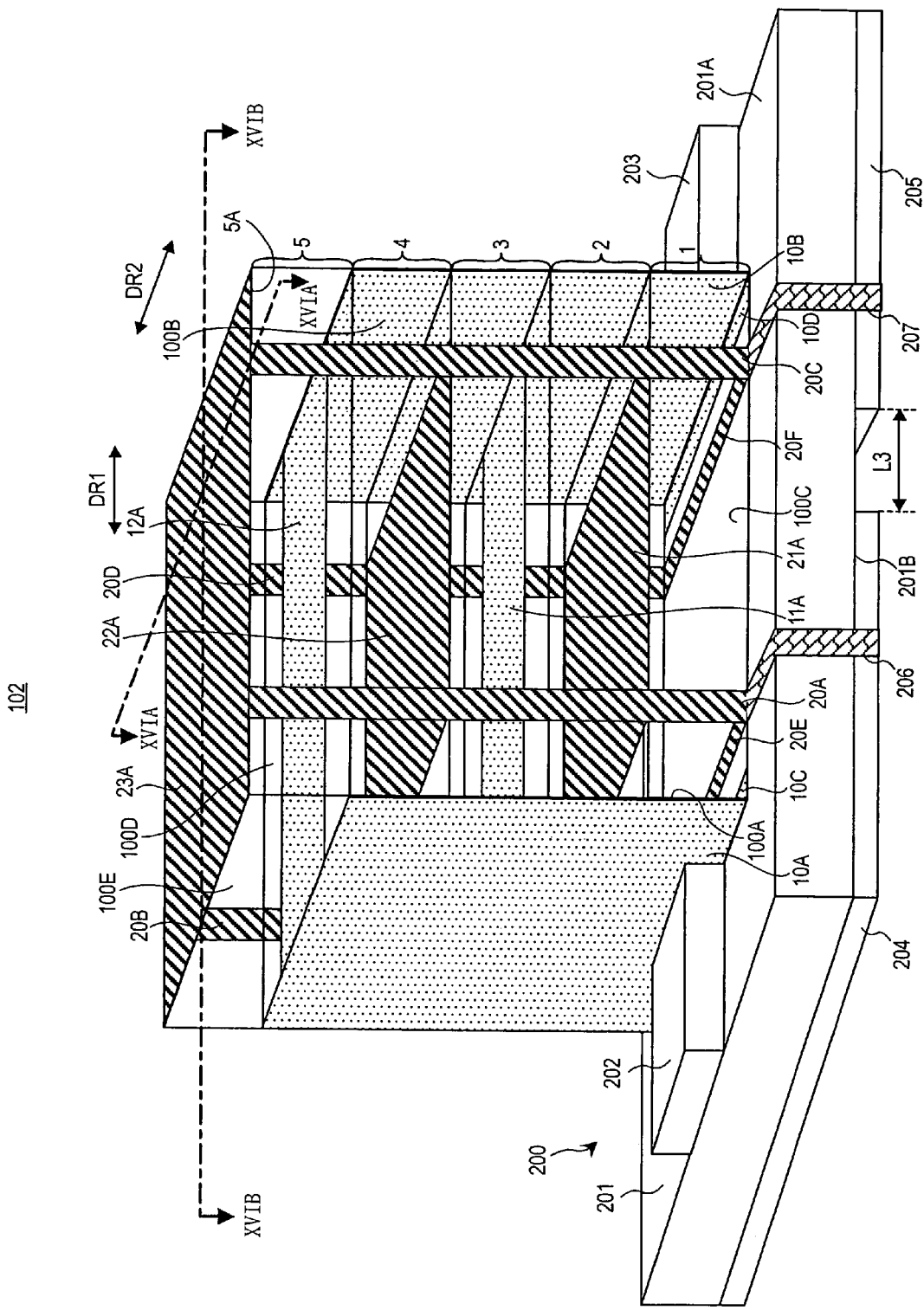
FIG. 24 is a conceptual illustration showing the structure of the electric circuit device according to the third embodiment.

FIG. 24 is a conceptual illustration showing the structure of the electric circuit device according to the third embodiment. Referring to FIG. 24, an electric circuit device 102 of the third embodiment includes conductive plates 11A, 12A, 21A to 23A instead of the conductive plates 11, 12, 21 to 23, respectively, and the same components as those of the electric circuit device 101 shown in FIG. 15.

The conductive plate 21A is placed between the dielectric layers 1 and 2, while the conductive plate 11A is placed between the dielectric layers 2 and 3. The conductive plate 22A is placed between the dielectric layers 3 and 4, while the conductive plate 12A is placed between the dielectric layers 4 and 5. The conductive plate 23A is placed on the principal surface 5A of the dielectric layer 5.

The conductive plates 11A, 12A have one end connected to the side anode electrode 10A and the other end connected to the side anode electrode 10B. The conductive plates 21A to 23A have one end connected to the side cathode electrodes 20A, 20B and the other end connected to the side cathode electrodes 20C, 20D.

The cross-sectional view of the electric circuit device 102 as taken along line XVIA-XVIA is the same as that of the electric circuit device 101 shown in FIG. 16A, while the cross-sectional view of the electric circuit device 102 as taken along line XVIB-XVIB is the same as that of the electric circuit device 101 shown in FIG. 16B. In FIGS. 16A and 16B, the conductive plates 11A, 12A, 21A to 23A can be replaced with the conductive plates 11, 12, 21 to 23.

Figure 25:
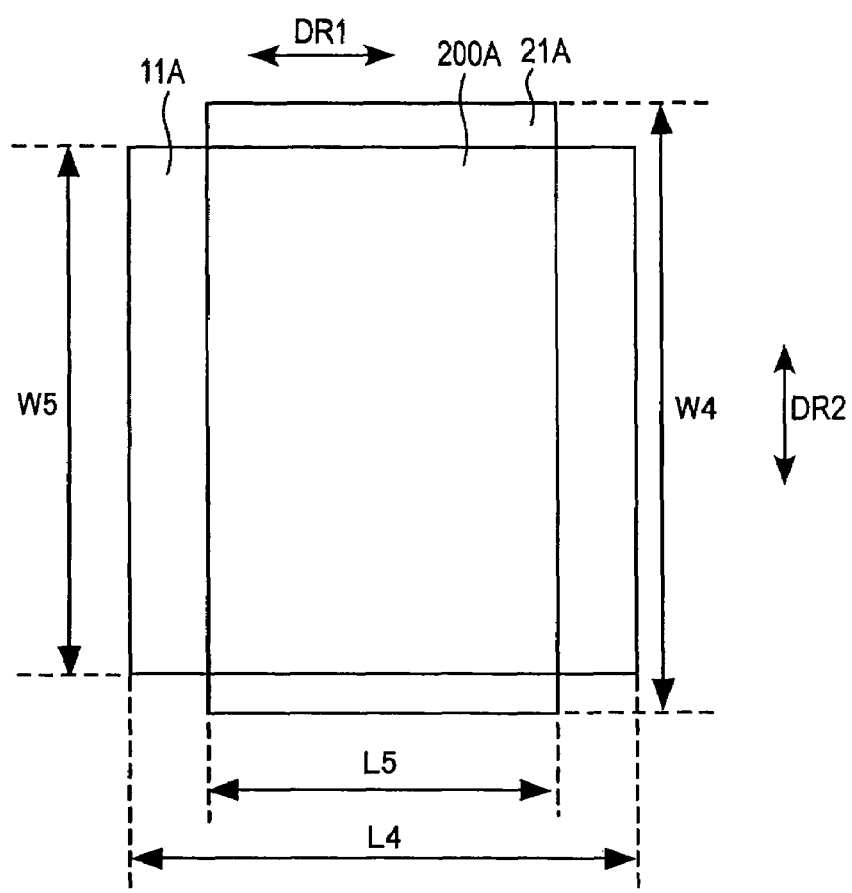
FIG. 25 is another plan view illustrating two adjacent conductive plates.

FIG. 25 is another plan view illustrating two adjacent conductive plates. Referring to FIG. 25, the conductive plate 11A has length L4 and width W5, while the conductive plate 21A has length L5 and width W4. Length L4 and width W5 have a relationship of W5≧L4, while length L5 and width W4 have a relationship of W4≧L5. The conductive plates 11A, 21A are thus in the longer form along the width direction DR2 than the longitudinal direction DR1.

The conductive plate 12A has same size as that of the conductive plate 11A, while the conductive plates 22A, 23A have same size as that of the conductive plate 21A.

Suppose the conductive plate 11A and conductive plate 21A are in one plane, the conductive plates 11A and 21A have an overlap part 200A. The overlap part 200A between the conductive plate 11A and conductive plate 21A has length L5 and width W5. Overlap parts between the conductive plate 11A and the conductive plate 22A, between the conductive plate 12A and the conductive plate 22A, and between the conductive plate 12A and the conductive plate 23A have the same length L5 and width W5 as the overlap part 200A. In the third embodiment, length L5 and width W5 are set so as to hold W5≧L5.

Where width W5 is not less than length L5 in the overlap part 200A, the current I1 passing in the conductive plate 11A flows in the central area of the overlap part 200A along the width direction DR2, while the current I2 passing in the conductive plate 21A flows in the edge area of the overlap part 200A along the width direction DR2, as shown in FIG. 10B. As a result, the effective inductance of the conductive plates 11A, 12A are slightly and relatively lower than the self-inductance of the conductive plates 11A, 12A, as discussed above.

Since the electric circuit device 102 comprises the conductive plates 204, 205 placed at the predefined distance L3, the conductive plates 204, 205 pass the return current Ir (current I2) through the conductive plates 21A to 23A.

As a result, as compared with the substrate 200 including a conductive plate on the principal surface 201B which is electrically connected between the cathode electrodes 20E and 20F, the more return current passes in the conductive plates 21A to 23A, thereby significantly and relatively reducing the effective inductance of the conductive plates 11A, 12A than the self-inductance of the conductive plates 11A, 12A.

Even though width W5 is not less than length L5 in the overlap part 200A, the inductance of the electric circuit device 102 can be reduced by arranging the conductive plates 204, 205 which are electrically separated along the direction in which the return current Ir flows.

Figure 26:
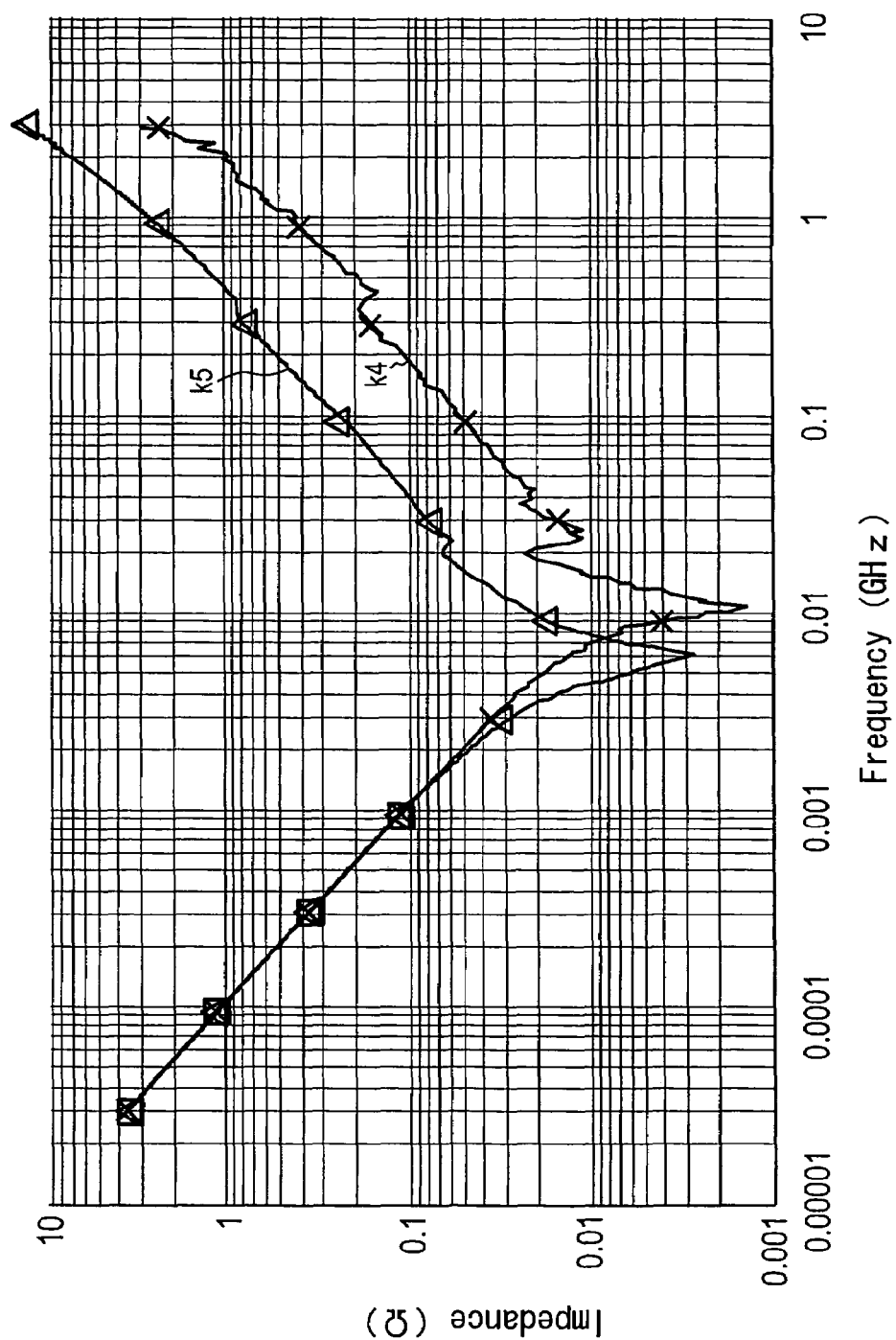
FIG. 26 is a view illustrating the frequency dependence of impedance in the electric circuit device shown in FIG. 24.

FIG. 26 is a view illustrating the frequency dependence of impedance in the electric circuit device 102 shown in FIG. 24. In FIG. 26, the horizontal axis indicates frequency, while the vertical axis indicates impedance. Curve k4 shows the frequency dependence of impedance in case when width W5 is not less than length L5 in the overlap part 200A and the separated conductive plates 204, 205 are included. Curve k5 shows the frequency dependence of impedance in case when width W5 is not less than length L5 in the overlap part 200A and the conductive plates 204, 205 are electrically connected.

Referring to FIG. 26, the low-frequency range with not more than 0.006 GHz is frequency range dominated by capacitance, while the high-frequency range with not less than 0.01 GHz is frequency range dominated by inductance.

In the low-frequency range with not more than 0.006 GHz dominated by capacitance, the impedance (curve k4) of the electric circuit device 102 when the conductive plates 204, 205 are electrically disconnected is almost same as the impedance (curve k5) of the electric circuit device 102 when the conductive plates 204, 205 are electrically connected.

In the high-frequency range with not less than 0.01 GHz dominated by inductance, the impedance (curve k4) of the electric circuit device 102 when the conductive plates 204, 205 are electrically disconnected is lower than the impedance (curve k5) of the electric circuit device 102 when the conductive plates 204, 205 are electrically connected.

Even when width W5 is not less than length L5 in the overlap part 200A, the inductance of the electric circuit device 102 can be lower by arranging the conductive plates 204, 205, which are electrically separated, on the substrate 200.

In the electric circuit device 102, any one of the substrates 200A, 200B, 200C, 200D, 200E can be used instead of the substrate 200. Each of the substrates 200A, 200B, 200C, 200D, 200E can reduce the impedance of the electric circuit device 102 as well as the substrate 200 can do.

Accordingly, the substrates 200, 200A, 200B, 200C, 200D, 200E can reduce the impedance, in the high-frequency range dominated by inductance, in the electric circuit devices 100, 101 that length L2 is not less than width W2 in the overlap part 20 between the conductive plates 11, 12 and the conductive plates 21 to 23 and in the electric circuit device 102 that width W5 is not less than length L5 in the overlap part 200A between the conductive plates 11A, 12A and the conductive plates 21A to 23A.

The above-discussed electric circuit device 102 is disposed between the power source 90 and the CPU 110 and confines a noise produced by the CPU 110 within the vicinity of the CPU 110 (see FIG. 12) as well as the electric circuit device 100.

According to the third embodiment, the electric circuit device 102 comprises the substrates 200, 200D (substrates 200A, 200B, 200C) including the conductive plates 204, 205 (conductive plates 209, 210, 212, 213) which are disposed at the predefined distance L3 and pass the return current Ir in the conductive plates 21A to 23A. Therefore, the afore-mentioned electric circuit device 102 can more reduce the impedance of the electric circuit device 102 than the electric circuit device 102 without comprising the substrates 200, 200D (substrates 200A, 200B, 200C) in the high-frequency range dominated by inductance.

According to the third embodiment, the electric circuit device 102 comprises the substrate 200E including the conductive plates 204, 205, which mainly pass the return current Ir in the conductive plates 21A to 23A, and the current control unit 220. Therefore, the afore-mentioned electric circuit device 102 can more reduce the impedance of the electric circuit device 102 than the electric circuit device 102 without comprising the substrate 200E in the high-frequency range dominated by inductance.

As to the other structure, the third embodiment is the same as the first and second embodiments.

In the third embodiment, the dielectric layers 1 to 5, conductive plates 11A, 12A, 21A to 23A, side anode electrodes 10A, 10B, anode electrodes 10C, 10D, side cathode electrodes 20A, 20B, 20C, 20D, and cathode electrodes 20E, 20F constitute "an electric element".

The conductive plates 204, 205 constitute "a first conductive plate". The conductive plate 204 constitutes "a first flat plate member", while the conductive plate 205 constitutes "a second flat plate member".

Figure 27A:
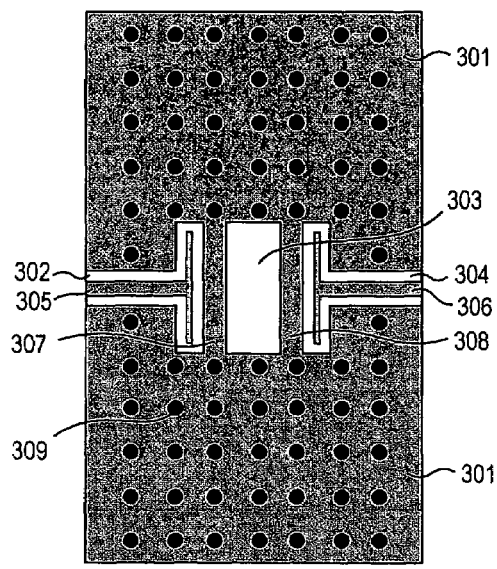
FIGS. 27A to 27D are plan views showing another structure of the substrate shown in FIG. 13.

FIGS. 27A to 27D are plan views showing another structure of the substrate shown in FIG. 13. Referring to FIG. 27A, a substrate 200F comprises a conductive plate 301, slits 302 to 304, and a via hole 309. The conductive plate 301 is formed on the entire principal surface of a dielectric layer (not shown). By partially cutting the conductive plate 301 away, the slits 302 to 304 are formed on the principal surface of the dielectric layer (not shown), thereby forming the conductor parts 305 to 308 on the principal surface of the dielectric layer (not shown).

As not shown in FIG. 27A, the substrate 200F comprises another conductive plate formed opposite to the conductive plate 301 on another principal surface of the dielectric layer (not shown). The via hole 309 is formed on a grid so as to electrically connect the conductive plate 301 to the another conductive plate.

When the electric circuit device is fabricated using the substrate 200F, the conductor parts 305, 306 constitute a signal line, the conductive plate 301 and the another conductive plate are connected to the ground potential, the anode electrodes 10C, 10D are connected to the conductor parts 305, 306, respectively, and cathode electrodes 20E, 20F are connected to the conductor parts 307, 308, respectively. As a result, the return current more flows in the conductive plates 21 to 23 and 21A to 23A than the conductive plate 301 and the another conductive plate of the substrate 200F.

Figure 27B:
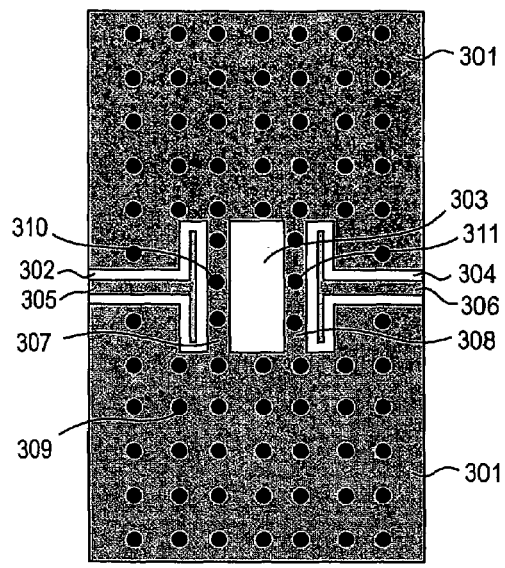

Referring FIG. 27B, a substrate 200G includes via holes 310, 311 and the same components as those of the substrate 200F shown in FIG. 27A. The via holes 310, 311 are formed on the conductor parts 307, 308, respectively.

When the electric circuit device is fabricated using the substrate 200G, the conductor parts 305, 306 constitute a signal line, the conductive plate 301 and another conductive plate is connected to the ground potential, the anode electrodes 10C, 10D are connected to the conductor parts 305, 306, respectively, and cathode electrodes 20E, 20F are connected to the conductor parts 307, 308, respectively. As a result, the return current more flows in the conductive plates 21 to 23 and 21A to 23A than the conductive plate 301 and the another conductive plate of the substrate 200G.

Figure 27C:
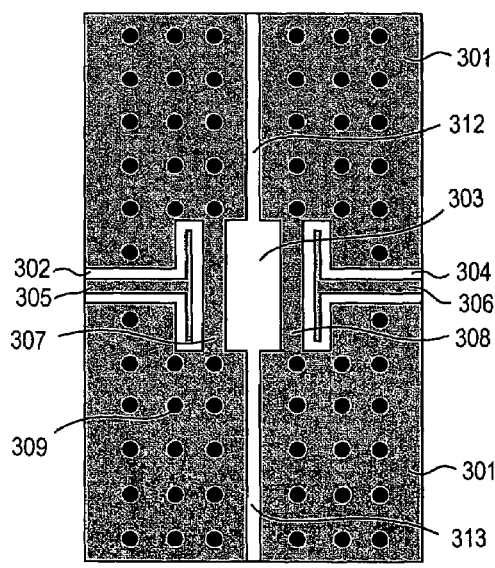

Referring to FIG. 27C, a substrate 200H includes slits 312, 313 and the same components as those of the substrate 200F. By partially cutting the conductive plate 301 away, the slits 312, 313 are formed on the principal surface of the dielectric layer (not shown) so as to connect with the slit 303, and then a slit comprising the slits 303, 312, 313 is formed over the substrate 200H along the direction perpendicular to a longitudinal direction of the conductor parts 305, 306 comprising the signal line.

When the electric circuit device is fabricated using the substrate 200H, the conductor parts 305, 306 constitute a signal line, the conductive plate 301 and another conductive plate are connected to the ground potential, the anode electrodes 10C, 10D are connected to the conductor parts 305, 306, respectively, and cathode electrodes 20E, 20F are connected to the conductor parts 307, 308, respectively. As a result, the return current more flows in the conductive plates 21 to 23 and 21A to 23A than the conductive plate 301 and the another conductive plate of the substrate 200H.

Figure 27D:
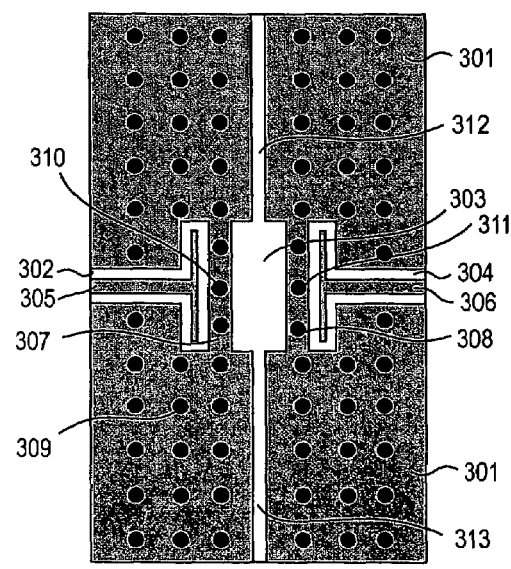

Referring to FIG. 27D, a substrate 200J includes slits 312, 313 and the same components as those of the substrate 200G. In the substrate 200J, by partially cutting the conductive plate 301 away, the slits 312, 313 are formed on the principal surface of the dielectric layer (not shown) so as to connect with the slit 303, and then a slit comprising the slits 303, 312, 313 is formed over the substrate 200J along the direction perpendicular to a longitudinal direction of the conductor parts 305, 306 comprising the signal line.

When the electric circuit device is fabricated using the substrate 200J, the conductor parts 305, 306 constitute a signal line, the conductive plate 301 and another conductive plate are connected to the ground potential, the anode electrodes 10C, 10D are connected to the conductor parts 305, 306, respectively, and cathode electrodes 20E, 20F are connected to the conductor parts 307, 308, respectively. As a result, the return current more flows in the conductive plates 21 to 23 and 21A to 23A than the conductive plate 301 and the another conductive plate of the substrate 200J.

Figure 28:
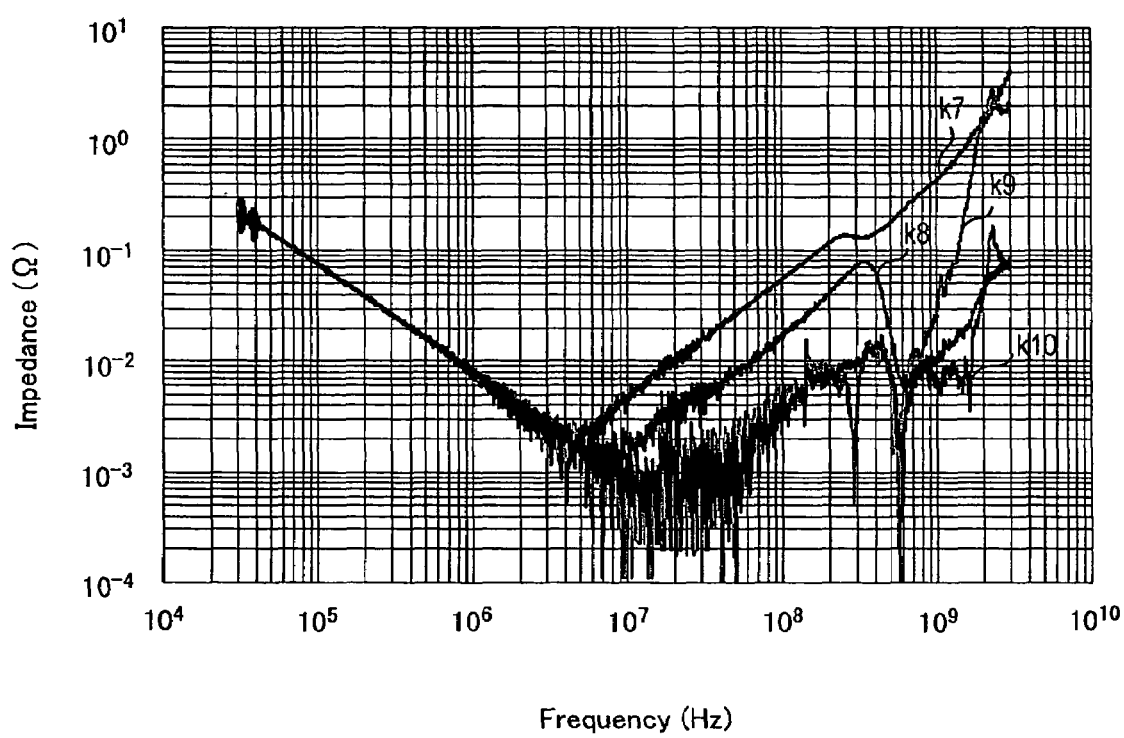
FIG. 28 is a view illustrating the relation of impedance and frequency in the electric circuit device using the substrate shown in FIG. 27.

FIG. 28 is a view illustrating the relation of impedance and frequency in the electric circuit device using the substrates 200F, 200G, 200H, 200J shown in FIGS. 27A to 27D, respectively. In FIG. 28, the horizontal axis indicates frequency, while the vertical axis indicates impedance. Curve k7 shows the relationship when the substrate 200F is used, curve k8 shows the relationship when the substrate 200G is used, curve k9 shows the relationship when the substrate 200H is used, and curve k10 shows the relationship when the substrate 200J is used.

By arranging the via holes 310, 311 on the conductor parts 307, 308, in which the cathode electrodes 20E, 20F are connected, the impedance is reduced in a frequency range dominated by inductance with not less than approximately 10 MH z (see curves k7, k8).

By arranging longer slits 312, 313 than the slit 303 between the conductor parts 307 and 308, in which the cathode electrodes 20E, 20F are respectively connected, the impedance is reduced in the frequency range dominated by inductance with not less than approximately 10 MH z (see curves k7 to k9).

By arranging the via holes 310,311 on the conductor parts 307, 308, in which the cathode electrode 20E, 20F are respectively connected, and the slits 312, 313, which are longer than the slit 303, between the conductor parts 307 and 308, the impedance is reduced in a frequency range with not less than approximately 1 GHz (see curves k9, k10). This is because the slits 312, 313 prevent current from flowing from the conductive plate 301 arranged on one side of the slits 312, 313 through the conductive plate 301 arranged on the other side of the slits 312, 313, thereby flowing in the conductive plates 21 to 23, 21A, 22A, 23A inside the electric element.

Figure 29:
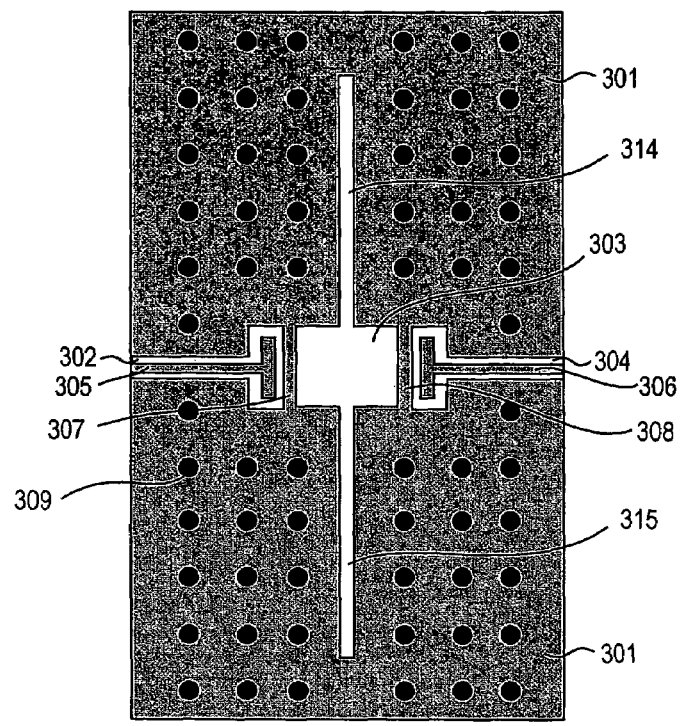
FIG. 29 is a plan view illustrating further another structure of the substrate shown in FIG. 13.

FIG. 29 is a plan view illustrating further another structure of the substrate shown in FIG. 13. Referring to FIG. 29, a substrate 200K includes slits 314, 315 and the same components as those of the substrate 200G shown in FIG. 27B. By partially cutting the conductive plate 301 away, the slits 314, 315 are formed on the principal surface of the dielectric layer (not shown) so as to connect with the slit 303, and then a slit comprising the slits 303, 314, 315 is partially formed on the substrate 200K along the direction perpendicular to a longitudinal direction of the conductor parts 305, 306 comprising the signal line.

Figure 30:
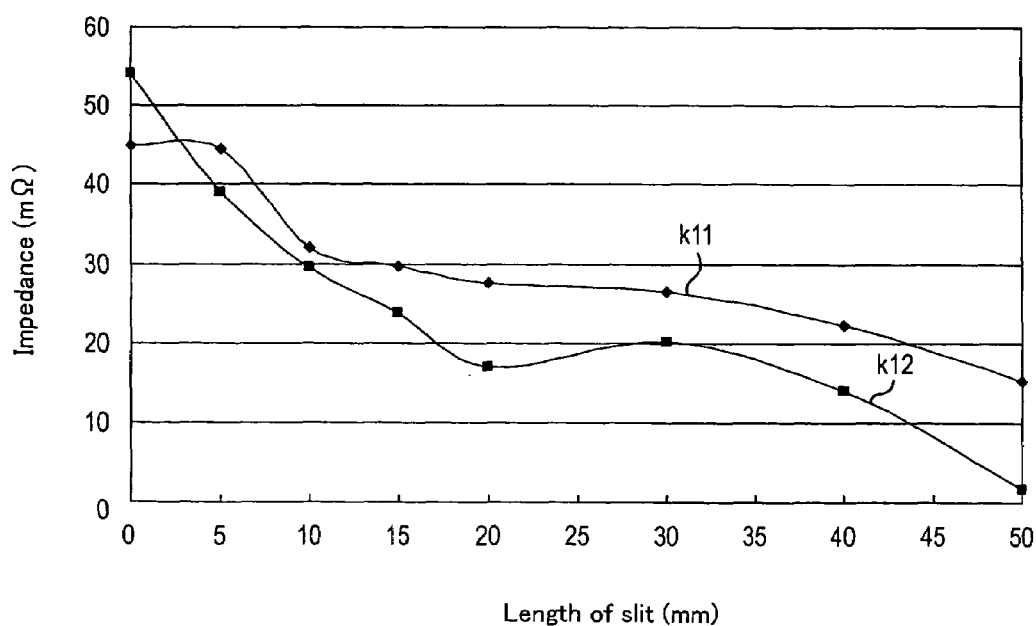
FIG. 30 is a view illustrating a change of impedance against the length of slit comprising three slits upon the fabrication of the electric circuit device using the substrate shown in FIG. 29.

FIG. 30 is a view showing a change of impedance against the length of slit comprising three slits 303, 314, 315 upon the fabrication of the electric circuit device using the substrate 200K shown in FIG. 29.

In FIG. 30, the horizontal axis indicates length of slit, while the vertical axis indicates impedance. Curve k11 shows simulation result, while curve k12 shows actual measurement value. The slit 303 is 5 mm in width and a frequency is 100 MH.

According to the result shown in FIG. 30, the impedance is reduced by setting length of the slit comprising the slits 303, 314, 315 at not less than 5 mm. In other words, the impedance is reduced by setting length of the slit comprising the slits 303, 314, 315 longer than width of the slit 303 (5 mm). Thus, the impedance of the electric circuit device can be reduced by partially arranging the slit comprising the slits 303, 314, 315 on the substrate 200K.

Figure 31:
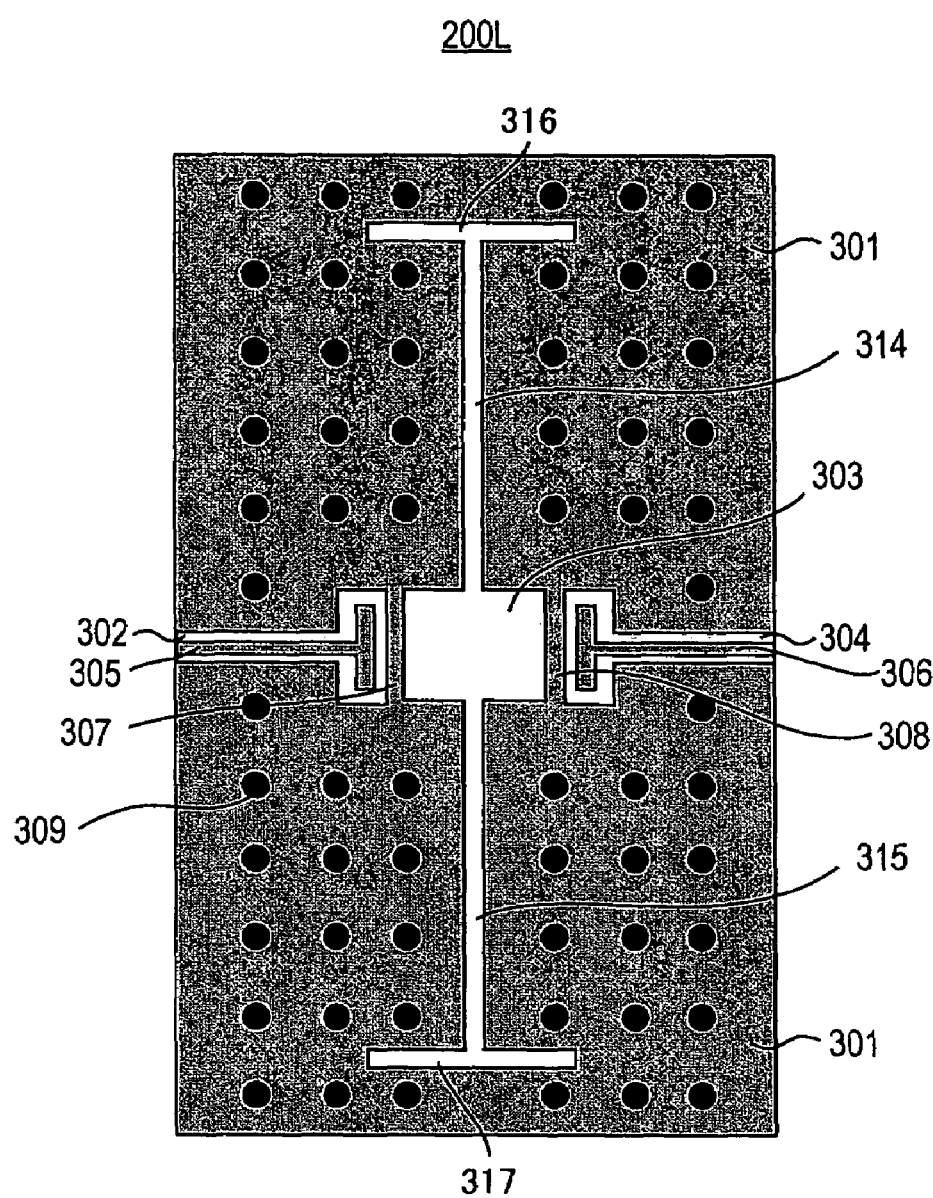
FIG. 31 is a plan view illustrating further another structure of the substrate shown in FIG. 13.

FIG. 31 is a plan view illustrating further another structure of the substrate shown in FIG. 13. Referring to FIG. 31, the substrate 200L includes slits 316, 317 and the same components as those of the substrate 200K shown in FIG. 29.

By partially cutting the conductive plate 301 away, the slit 316 is formed on the principal surface of the dielectric layer (not shown) so as to connect approximately perpendicular to one end of the slit 314. The slit 316 has a predefined length extending to the both sides of the slit 314. By partially cutting the conductive plate 301 away, the slit 317 is formed on the principal surface of the dielectric layer (not shown) so as to connect approximately perpendicular to one end of the slit 315. The slit 317 has same length as that of the slit 316 extending to the both sides of the slit 315.

Figure 32:
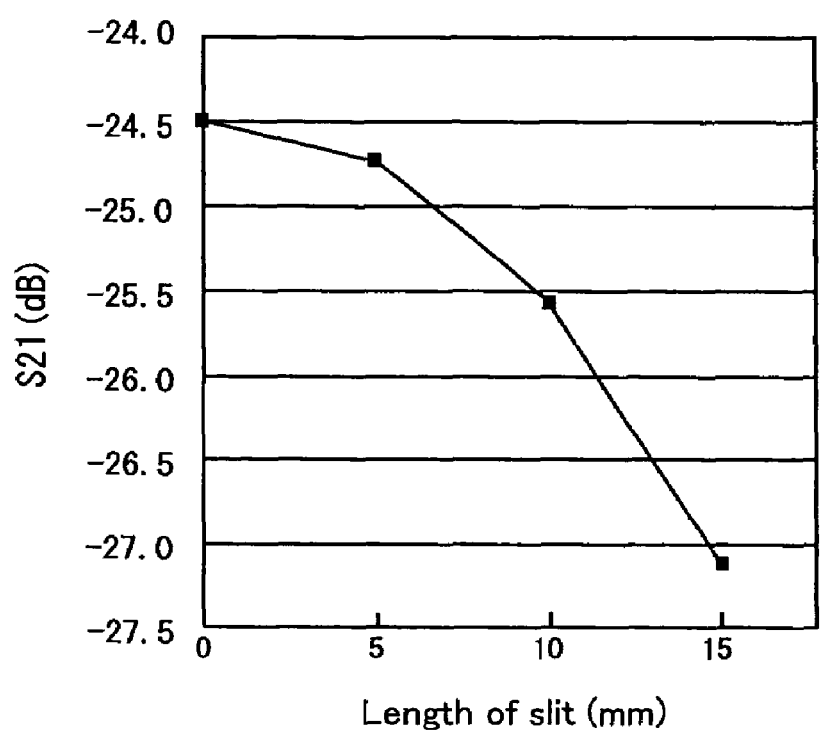
FIG. 32 is a view illustrating the relation of length of slits shown in FIG. 31 and S21.

FIG. 32 is a view illustrating the relation of lengths of slits 316, 317 shown in FIG. 31 and S21. In FIG. 32, the vertical axis indicates S21, while the horizontal axis indicates slit length. S21 is a transmission characteristic of current flowing from the conductive plate 301 on one side of the slits 314, 315 to the conductive plate 301 on the other side of the slits 314, 315.

Referring to FIG. 32, the transmission characteristic S21 is reduced with an increasing slit length of the slits 316, 317 to 5 mm, 10 mm, and 15 mm. This is because that the slits 316, 317 prevent a current from passing from one side to the other side of the slits 314, 315, through the conductive plate 301 where the slits 314, 315 are not formed. The longer the lengths of the slits 316, 317, the more the slits 316, 317 prevent the current from passing around.

Accordingly, the substrate 200L allows the return current to easily pass in the conductive plates 21 to 23, 21A, 22A, 23A inside the electric element, thereby more reducing the effective inductance than the self-inductance of the conductive plates 11, 12 and 11A, 12A.

Figure 33:
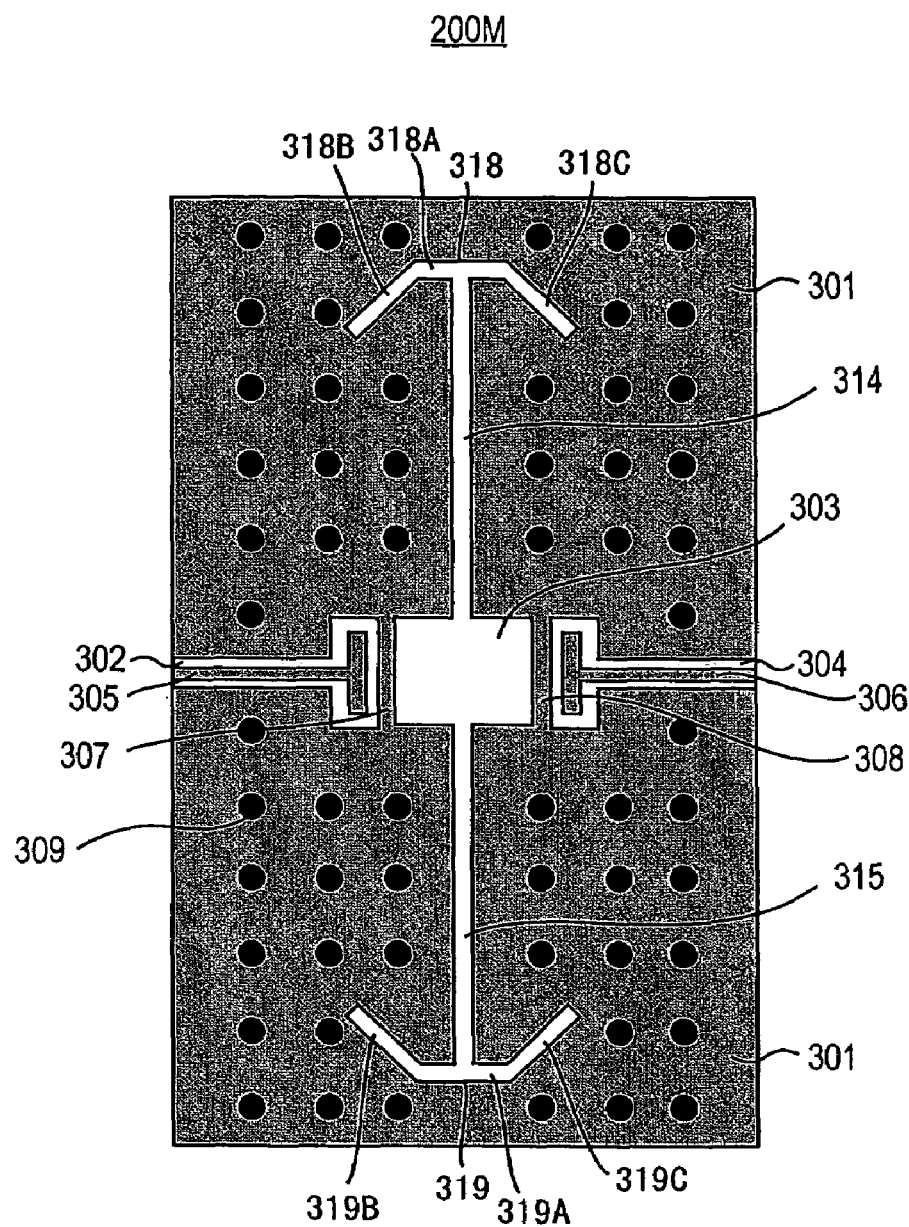
FIG. 33 is a plan view illustrating further another structure of the substrate shown in FIG. 13.

FIG. 33 is a plan view illustrating further another structure of the substrate shown in FIG. 13. Referring to FIG. 33, the substrate 200M includes slits 318, 319 instead of the slits 316, 317, respectively and the same components as those of the substrate 200L shown in FIG. 31.

By partially cutting the conductive plate 301 away, the slit 318 is formed on the principal surface of the dielectric layer (not shown) so as to connect with one end of the slit 314. By partially cutting the conductive plate 301 away, the slit 319 is formed on the principal surface of the dielectric layer (not shown) so as to connect to one end of the slit 315.

The slit 318 comprises linear portions 318A, 318B, 318C. The linear portion 318A is formed approximately perpendicular to the slit 314. The linear portion 318B extends along the direction of the predefined angle to the linear portion 318A from one end of the linear portion 318A. The linear portion 318C extends along the direction of the predefined angle to the linear portion 318A from the other end of the linear portion 318A. As a result, the linear portions 318B, 318C are disposed approximately slanting to the direction toward the slit 303 on both ends of the linear portion 318A.

The slit 319 comprises linear portions 319A, 319B, 319C. The linear portion 319A is formed approximately perpendicular to the slit 315. The linear portion 319B extends along the direction of the predefined angle to the linear portion 319A from the one end of the linear portion 319A. The linear portion 319C extends along the direction of the predefined angle to the linear portion 319A from the other end of the linear portion 319A. As a result, the linear portions 319B, 319C are disposed approximately slanting to the direction toward the slit 303 on both ends of the linear portion 319A.

As with the slits 316, 317, the slits 318, 319 can reduce the transmission characteristic S21 and prevent the current from passing from one side to the other side of the slits 314, 315, through the conductive plate 301 where the slits 314, 315 are not formed.

Figure 34:
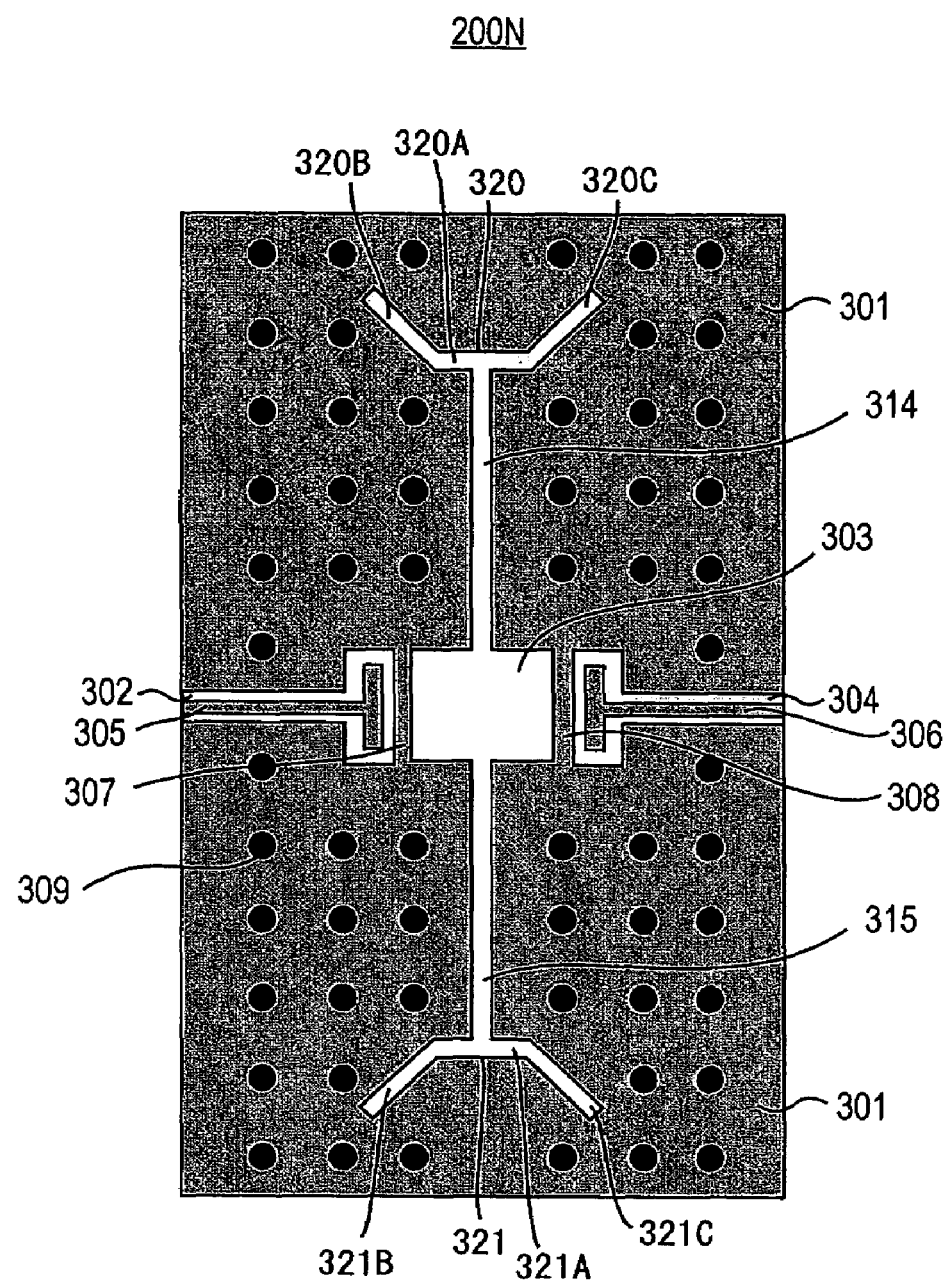
FIG. 34 is a plan view illustrating further another structure of the substrate shown in FIG. 13.

FIG. 34 is a plan view illustrating further another structure of the substrate shown in FIG. 13. Referring to FIG. 34, the substrate 200N includes slits 320, 321 instead of the slits 316, 317, respectively and the same components as those of the substrate 200L shown in FIG. 31.

By partially cutting the conductive plate 301 away, the slit 320 is formed on the principal surface of the dielectric layer (not shown) so as to connect with one end of the slit 314. By partially cutting the conductive plate 301 away, the slit 321 is formed on the principal surface of the dielectric layer (not shown) so as to connect to one end of the slit 315.

The slit 320 comprises linear portions 320A, 320B, 320C. The linear portion 320A is formed approximately perpendicular to the slit 314. The linear portion 320B extends along the direction of the predefined angle to the linear portion 320A from one end of the linear portion 320A. The linear portion 320C extends along the direction of the predefined angle to the linear portion 320A from the other end of the linear portion 320A. As a result, the linear portions 320B, 320C are disposed approximately slanting to the direction opposite to the slit 303 on both ends of the linear portion 320A.

The slit 321 comprises linear portions 321A, 321B, 321C. The linear portion 321A is formed approximately perpendicular to the slit 315. The linear portion 321B extends along the direction of the predefined angle to the linear portion 321A from one end of the linear portion 321A. The linear portion 321C extends along the direction of the predefined angle to the linear portion 321A from the other end of the linear portion 321A. As a result, the linear portions 321B, 321C are disposed approximately slanting to the direction opposite to the slit 303 on both ends of the linear portion 321A.

As with the slits 316, 317, the slits 320, 321 can reduce the transmission characteristic S21 and prevent the current from passing from one side to the other side of the slits 314, 315, through the conductive plate 301 where the slits 314, 315 are not formed.

Figure 35:
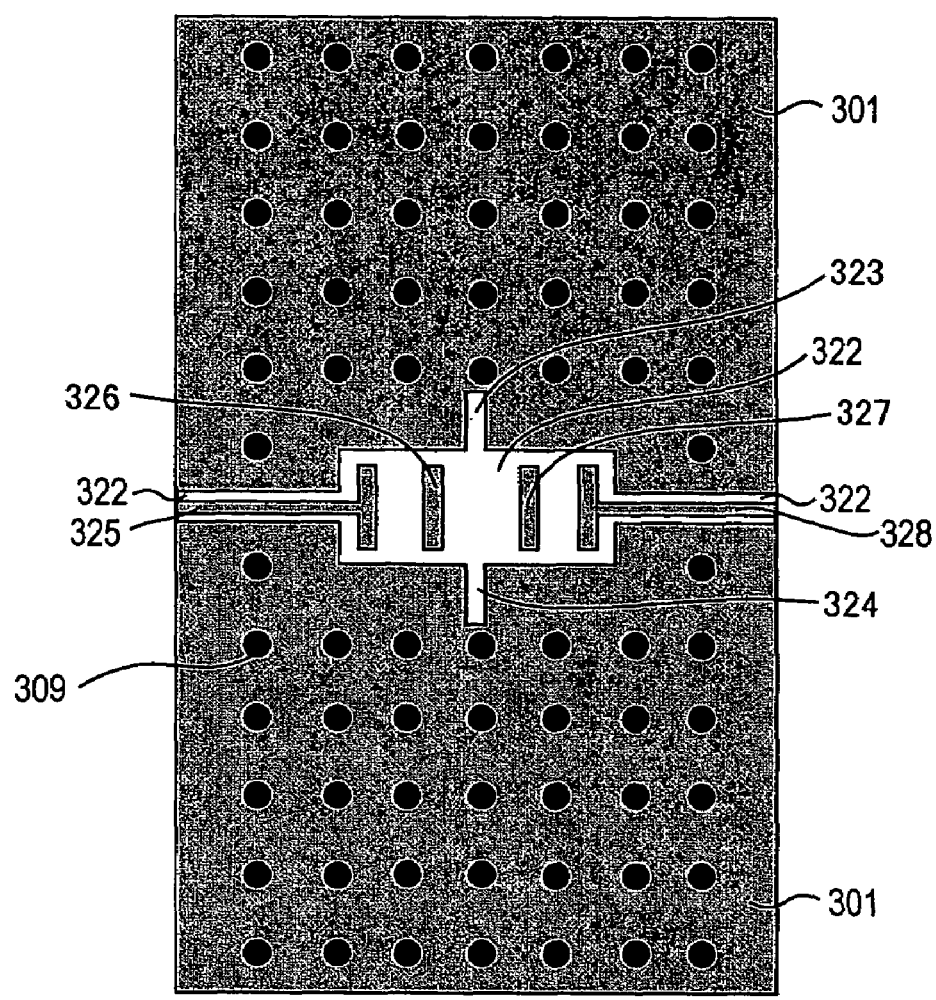
FIG. 35 is a plan view illustrating further another structure of the substrate shown in FIG. 13.

FIG. 35 is a plan view illustrating further another structure of the substrate shown in FIG. 13. Referring to FIG. 35, a substrate 200P includes slits 322 to 324 instead of the slits 302 to 304, respectively and the same components as those of the substrate 200F shown in FIG. 27A.

By partially cutting the conductive plate 301 away, the slit 322 is formed on the principal surface of the dielectric (not shown), thereby forming the conductor parts 325 to 328 on the principal surface of the dielectric (not shown).

By partially cutting the conductive plate 301 away, the slit 323 is formed on the principal surface of the dielectric layer (not shown) so as to connect with the slit 322 on one side. By partially cutting the conductive plate 301 away, the slit 324 is formed on the principal surface of the dielectric layer (not shown) so as to connect with the slit 322 on the other side.

When the electric circuit device is fabricated using the substrate 200P, the conductor parts 325, 328 constitute a signal line, the conductive plate 301 and another conductive plate are connected to the ground potential, the anode electrodes 10C, 10D are connected to the conductor parts 325, 328, respectively, and cathode electrodes 20E, 20F are connected to the conductor parts 326, 327, respectively. As a result, the return current more flows in the conductive plates 21 to 23 and 21A to 23A than the conductive plate 301 and the another conductive plate of the substrate 200P.

Figure 36:
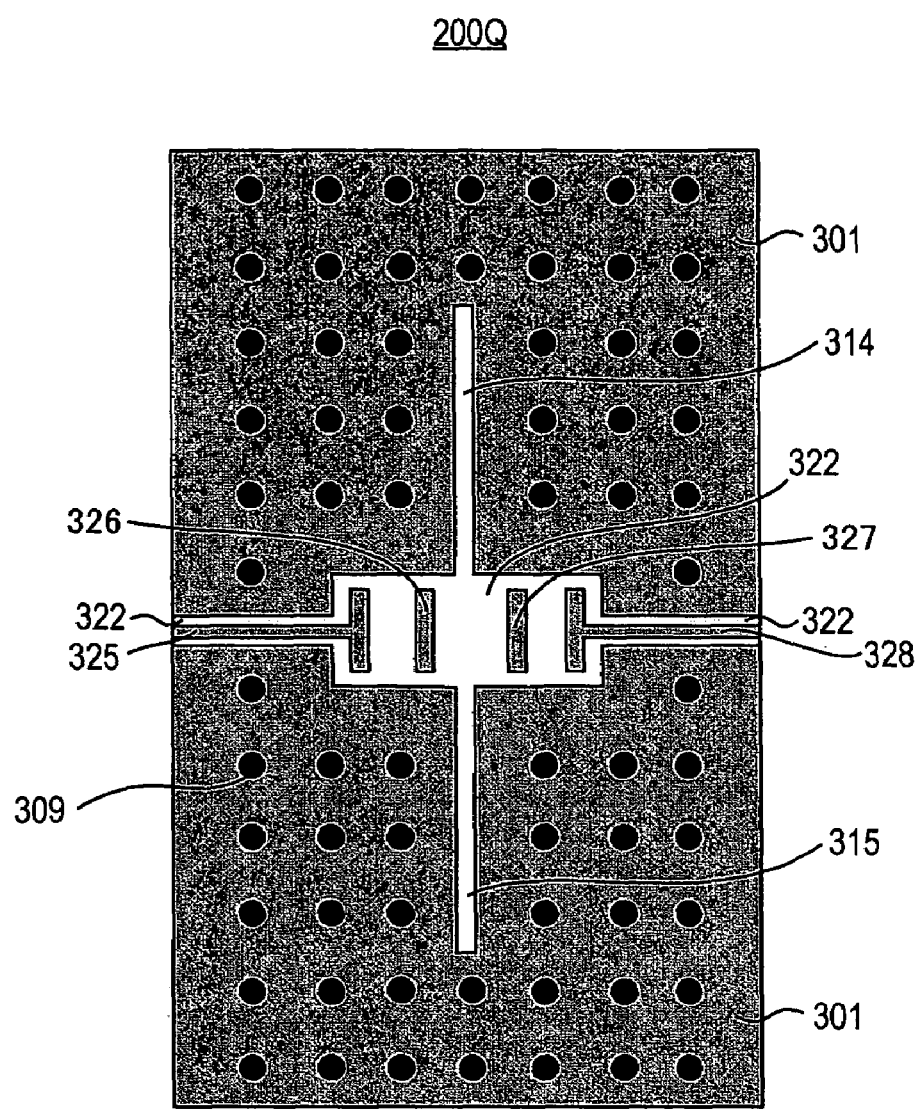
FIG. 36 is a plan view illustrating further another structure of the substrate shown in FIG. 13.

FIG. 36 is a plan view illustrating further another structure of the substrate shown in FIG. 13. Referring to FIG. 36, the substrate 200Q includes slits 314, 315 instead of the slits 323, 324, respectively and the same components as those of the substrate 200P shown in FIG. 35.

By partially cutting the conductive plate 301 away, the slits 314, 315 are formed on the principal surface of the dielectric layer (not shown) so as to connect with the slit 322, and then a slit comprising the slits 322, 314, 315 is partially formed on the substrate 200Q along the direction perpendicular to a longitudinal direction of the conductor parts 325, 328 comprising the signal line.

Figure 37:
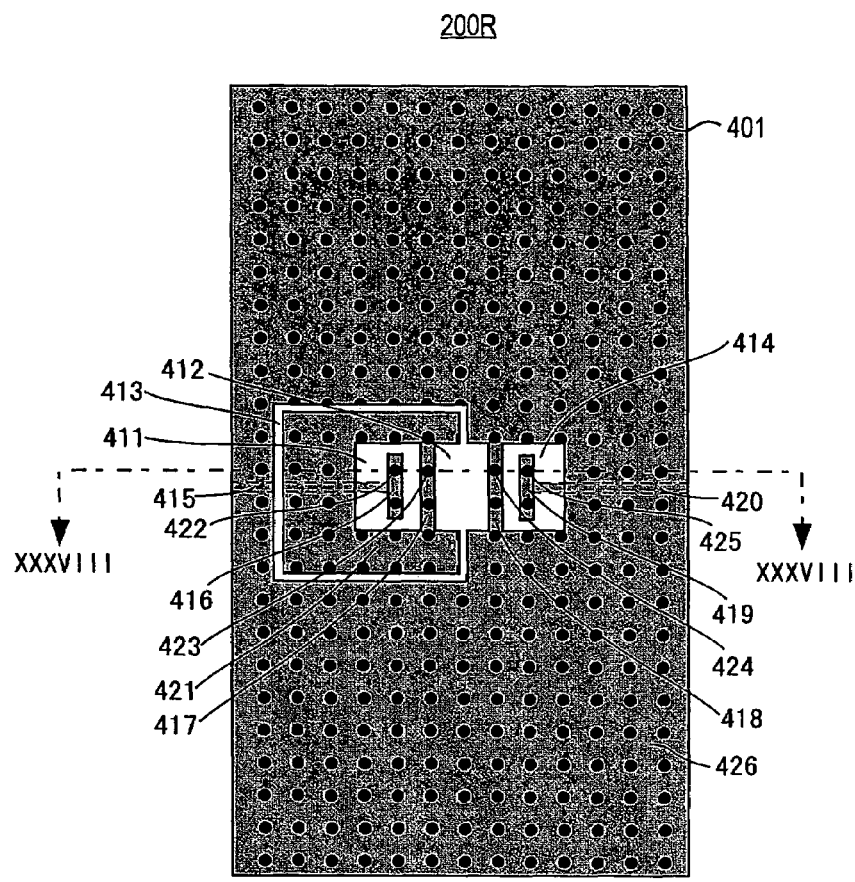
FIG. 37 is a plan view illustrating further another structure of the substrate shown in FIG. 13.
Figure 38:
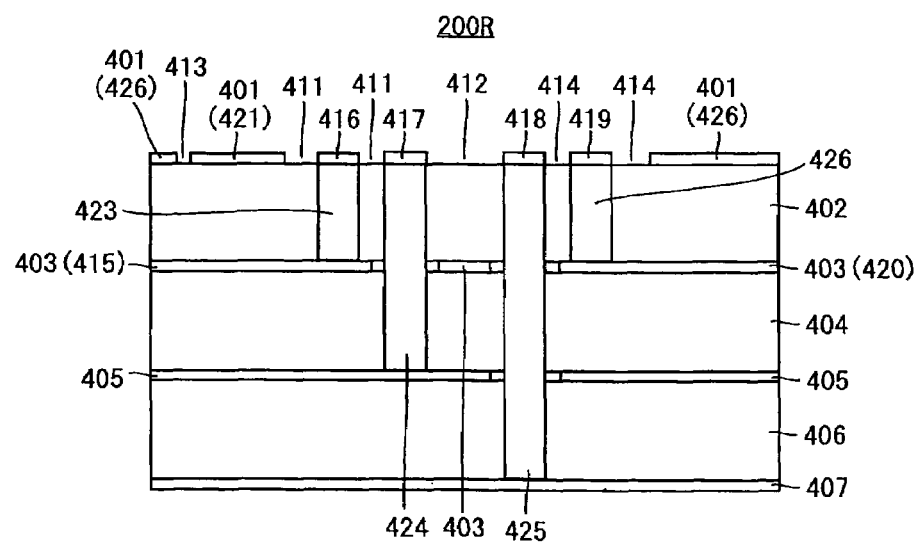
FIG. 38 is a cross-section view of a substrate 200R along the line between XXXVIII to XXXVIII shown in FIG. 37.

FIG. 37 is a plan view illustrating further another structure of the substrate shown in FIG. 13. FIG. 38 is a cross-section view of a substrate 200R along the line between XXXVIII to XXXVIII shown in FIG. 37. Referring to FIGS. 37 and 38, the substrate 200R includes conductive plates 401, 403, 405, 407, dielectrics 402, 404, 406, slits 411, 412, 413, 414, and conductor parts 415, 416, 417, 418, 419, 420, 421, 426.

The conductive plate 401 is formed on a surface of the dielectric 402, the conductive plate 403 is formed on a surface of the dielectric 404, the conductive plate 405 is formed on a surface of the dielectric 406, and the conductive plate 407 is formed on rear face of the dielectric 406. The dielectric 404, where the conductive plate 403 is formed, is stacked on the dielectric 406, where the conductive plates 405, 407 are formed, while the dielectric 402, where the conductive plate 401 is formed, is stacked on the dielectric 404, where the conductive plate 403 is formed.

By partially cutting the conductive plate 401 away, the slits 411 to 414 are formed on a surfaces of the dielectric 402, and then the slits 411, 412, 414 are linearly disposed along the width direction of the substrate 200R. The slit 413 is formed so as to be connected to the slit 412 on both sides and to surround the slit 411. In this configuration, the width of slit 413 is determined according to wavelength of the high-frequency current and relative permittivity of the dielectric 402, and the width value is so set that the high-frequency current is not flowing the conductor part 426 which is formed outside of the slit 413, beyond the conductor part 421 which is formed inside of the slit 413.

As a result, the conductive plate 401 is separated into the conductor part 421 and the conductor part 426. The conductor parts 416 to 419 are formed on the surface of the dielectric 402. In this configuration, the conductor part 417 has both ends connected to the conductor part 421, while the conductor part 418 has both ends connected to the conductor part 426.

By partially cutting the conductive plate 403 away, the conductor part 415 is formed on a surface of the dielectric 404, and a via hole 423 connects the conductor part 415 to the conductor part 416. By partially cutting the conductive plate 403 away, the conductor part 420 is formed on a surface of the dielectric 404, and a via hole 426 connects the conductor part 420 to the conductor part 419.

A via hole 424 connects the conductor part 417 to the conductive plate 405, while a via hole 425 connects the conductor part 418 to the conductive plate 407. The via holes connect the conductor part 421 to the conductive plate 405 and connect the conductor part 426 to the conductive plate 407. The conductive plates 401, 405, 407 are connected to the ground potential.

When the electric circuit device is fabricated using the substrate 200R, the conductor parts 415, 416, 419, 420 and the via holes 423, 426 constitute signal line, the anode electrode 10C is connected to the conductor part 415, the anode electrode 10D is connected to the conductor part 420, the cathode electrode 20E is connected to the conductor part 417, and the cathode electrode 20F is connected to the conductor part 418. As a result, the return current flows in the conductive plates 21 to 23 and 21A to 23A inside the electric element.

Since the conductor parts 417, 418, in which the cathode electrodes 20E, 20F are connected, are respectively connected to the conductor parts 421, 426 separated by the slit 413 and the conductor parts 421, 426 are respectively connected to the conductive plates 405, 407, the return current thus flows in the conductive plates 21 to 23 and 21A to 23A inside the electric element.

Accordingly, the substrate 200R allows the return current to completely flow in the conductive plates 21 to 23 and 21A to 23A inside the electric element, thereby more reducing the effective inductance than the self-inductance of the conductive plates 11, 12, 11A, 12A. As a result, the impedance of the electric circuit devices 100, 101, 102 can be reduced.

It should be understood that the embodiments disclosed herein are to be taken as examples and are not limited. The scope of the present invention is defined not by the above described embodiments but by the following claims. All changes that fall within meets and bounds of the claims, or equivalence of such meets and bounds are intended to be embraced by the claims.

What is claimed is:

1. An electric circuit device, comprising:
a substrate including a first conductive plate; and
an electric element formed on the substrate, wherein
the electric element, including:
an n-number (n is a positive integer) of second conductive plate respectively passing a first current from a power source side to an electrical load circuit side; and
an m-number (m is a positive integer) of third conductive plate being alternately stacked to the n-number of the second conductive plate and each passing a second current, which is a return current of the first current, from the electrical load circuit side to the power source side, wherein
the first conductive plate passes the second current, which is received from the electrical load circuit side, to one each end of the m-number of third conductive plate, while passing the second current, which is received from the other each end of the m-number of third conductive plate, to the power source side,
the n-number of second conductive plate has lower inductance than a self-inductance when the first and second currents respectively flows in the n-number of second conductive plate and the m-number of third conductive plate, and
when the length of the second and third conductive plates along direction perpendicular to direction in which the first and second currents flow is W, and the length of the second and third conductive plates along the direction in which the first and second currents flow is L, in a overlap part between the second and third conductive plates, W and L have a relationship of W≧L, wherein
the second current, including:
a component of the first current passing in the m-number of third conductive plate; and
a component of the second current passing in the first conductive plate, wherein
the first conductive plate, including:
a first flat plate member being connected to the one each end of the m-number of third conductive plate;
a second flat plate member being connected to the other each end of the m-number of third conductive plate; and
a current control unit being disposed between the first flat plate member and the second flat plate member and more reducing the component of second current than that of first current.

2. The electrical circuit device according to claim 1, wherein
the current control unit sets the component of second current to zero.

3. An electric circuit device, comprising:

a substrate including a first conductive plate; and an electric element formed on the substrate, wherein the electric element, including:

an n-number (n is a positive integer) of second conductive plate respectively passing a first current from a power source side to an electrical load circuit side; and an m-number (m is a positive integer) of third conductive plate being alternately stacked to the n-number of the second conductive plate and each passing a second current, which is a return current of the first current, from the electrical load circuit side to the power source side, wherein the first conductive plate passes the second current, which is received from the electrical load circuit side, to one each end of the m-number of third conductive plate, while passing the second current, which is received from the other each end of the m-number of third conductive plate, to the power source side, the n-number of second conductive plate has lower inductance than a self-inductance when the first and second currents respectively flows in the n-number of second conductive plate and the m-number of third conductive plate, and when the length of the second and third conductive plates along direction perpendicular to direction in which the first and second currents flow is W, and the length of the second and third conductive plates along the direction in which the first and second currents flow is L, in a overlap part between the second and third conductive plates, W and L have a relationship of W≧L, wherein the first conductive plate, including:

a first flat plate member being connected to both ends of the m-number of third conductive plate at one end side of the m-number of third conductive plate; and a second flat plate member being connected to both ends of the m-number of third conductive plate at the other end side of the m-number of third conductive plate and being separated from the first flat plate member.

4. The electrical circuit device according to claim 3, wherein a distance between the first flat plate member and the second flat plate member is set to relatively large value.

5. An electrical circuit device, comprising:

an n-number (n is a positive integer) of a first conductive plate respectively passing a first current from a power source side to an electrical load circuit side;

an m-number (m is a positive integer) of a second conductive plate being alternately stacked to the n-number of first conductive plate and each passing a second current, which is a return current of the first current, from the electrical load circuit side to the power source side, wherein the n-number of first conductive plate has lower inductance than a self-inductance when the first and second currents respectively flows in the n-number of first conductive plate and the m-number of second conductive plate, and when length of the first and second conductive plates along direction perpendicular to direction in which the first and second currents flow is W, and the length of the first and second conductive plates along the direction in which the first and second currents flow is L, in a overlap part between the first and second conductive plates, W and L have a relationship of L≧W, said electrical circuit device further comprising:

a substrate including a third conductive plate, wherein the n-number of first conductive plate and the m-number of second conductive plate are formed on the substrate, wherein the second current, including:

a component of the first current passing in the m-number of second conductive plate; and a component of the second current passing in the third conductive plate, wherein the third conductive plate, including:

a first flat plate member being connected to the one each end of the m-number of second conductive plate;

a second flat plate member being connected to the other each end of the m-number of second conductive plate; and a current control unit being disposed between the first flat plate member and the second flat plate member and more reducing the component of second current than that of first current.

6. The electrical circuit device according to claim 5, wherein the current control unit sets the component of second current to zero.

7. A substrate relatively reducing an impedance of an electric element, wherein the electric element, including:

an n-number (n is a positive integer) of first conductive plate respectively passing a first current from a power source side to an electrical load circuit side; and an m-number (m is a positive integer) of second conductive plate being alternately stacked to the n-number of first conductive plate and each passing a second current, which is a return current of the first current, from the electrical load circuit side to the power source side, wherein when the first and second currents respectively flow in the n-number of first conductive plate and the m-number of second conductive plate, the n-number of first conductive plate has lower inductance than a self-inductance, wherein the substrate, comprising:

a dielectric;

a third conductive plate being placed on a principal surface of dielectric;

a first slit forming a first conductor part, which is connected to one each end of the n-number of first conductive plate, on the principal surface;

a second slit forming a second conductor part, which is connected to the other each end of the n-number of first conductive plate, on the principal surface; and a third slit being disposed between the first slit and the second slit and forming third and fourth conductor parts, which are respectively connected to each both ends of the m-number of second conductive plate, on the principal surface.

8. The substrate according to claim 7, wherein the substrate further includes a fourth slit extending from the third slit along the direction approximately perpendicular to direction in which the second current flows.

9. The substrate according to claim 8, wherein the substrate further includes a fifth slit being formed on both ends of the fourth slit and extending along the direction of a predefined angle to the fourth slit.

10. An electric circuit device, comprising:

an n-number (n is a positive integer) of a first conductive plate respectively passing a first current from a power source side to an electrical load circuit side; and an m-number (m is a positive integer) of a second conductive plate being alternately stacked to the n-number of first conductive plate and each passing a second current, which is a return current of the first current, from the electrical load circuit side to the power source side, wherein the n-number of first conductive plate has lower inductance than a self-inductance when the first and second currents respectively flows in the n-number of first conductive plate and the m-number of second conductive plate, and when length of the first and second conductive plates along direction perpendicular to direction in which the first and second currents flow is W, and the length of the first and second conductive plates along the direction in which the first and second currents flow is L, in a overlap part between the first and second conductive plates, W and L have a relationship of L≧W, the electrical circuit device, further comprising:

a substrate where the n-number of first conductive plate and the m-number of second conductive plate are placed, wherein the substrate, including:

a third conductive plate formed on a principal surface;

a first slit forming a first conductor part, which is connected to the one each end of the n-number of first conductive plate, on the principal surface;

a second slit forming a second conductor part, which is connected to the other each end of the n-number of first conductive plate, on the principal surface; and a third slit being disposed between the first slit and the second slit and forming third and fourth conductor parts, which are connected to each both ends of the m-number of second conductive plate, on the principal surface.

11. The electrical circuit device according to claim 10, wherein the substrate further includes a fourth slit extending from the third slit along direction approximately perpendicular to direction in which the second current flows.

12. The electrical circuit device according to claim 11, wherein the substrate further includes a fifth slit being formed on both ends of the fourth slit and extending along direction of a predefined angle to the fourth slit.

13. An electric circuit device, comprising:

an n-number (n is a positive integer) of a first conductive plate respectively passing a first current from a power source side to an electrical load circuit side; and an m-number (m is a positive integer) of a second conductive plate being alternately stacked to the n-number of first conductive plate and each passing a second current, which is a return current of the first current, from the electrical load circuit side to the power source side, wherein the n-number of first conductive plate has lower inductance than a self-inductance when the first and second currents respectively flows in the n-number of first conductive plate and the m-number of second conductive plate, and when length of the first and second conductive plates along direction perpendicular to direction in which the first and second currents flow is W, and the length of the first and second conductive plates along the direction in which the first and second currents flow is L, in a overlap part between the first and second conductive plates, W and L have a relationship of L≧W, the electrical circuit device further comprising:

a substrate including a third conductive plate, wherein the n-number of first conductive plate and the m-number of second conductive plate are formed on the substrate, wherein the third conductive plate, including:

a first flat plate member being connected to both ends of the m-number of second conductive plate at one end side of the m-number of second conductive plate; and a second flat plate member being connected to both ends of the m-number of second conductive plate at the other end side of the m-number of second conductive plate and separated from the first flat plate member.

14. A substrate relatively reducing an impedance of an electric element, wherein the electric element, including:

an n-number (n is a positive integer) of first conductive plate respectively passing a first current from a power source side to an electrical load circuit side; and an m-number (m is a positive integer) of second conductive plate being alternately stacked to the n-number of first conductive plate and each passing a second current, which is a return current of the first current, from the electrical load circuit side to the power source side, the substrate, comprising:

a dielectric;

a third conductive plate being placed on a principal surface of the dielectric and being connected to both ends of the m-number of second conductive plate at one end side of the m-number of second conductive plate; and a fourth conductive plate being placed on the principal surface at a predefined distance away from the third conductive plate and being connected to both ends of the m-number of second conductive plate at the other end side of m-number of the second conductive plate.

15. The substrate according to claim 14, further comprising:

a first signal wire being placed on the principal surface of dielectric and being connected to one each end of the n-number of first conductive plate; and a second signal wire being placed on the principal surface where the first signal wire is placed and being connected to the other each end of the n-number of first conductive plate, wherein the third and fourth conductive plates are placed on the different principal surface from the first and second signal wires.

16. The substrate according to claim 14, further comprising:

a first signal wire being placed on the principal surface of dielectric and being connected to one each end of the n-number of first conductive plate; and a second signal wire being placed on the principal surface where the first signal wire is placed and being connected to the other each end of the n-number of first conductive plate, wherein the third conductive plate, including:

first and second flat plate members being disposed on both sides of the first signal wire on the same principal surface as the first signal wire; and a third flat plate member being placed on the different principal surface from the first signal wire, wherein the fourth conductive plate, including:

forth and fifth flat plate members being disposed on both sides of the second signal wire on the same principal surface as the second signal wire; and a sixth flat plate member being disposed on the different principal surface from the second signal wire.

17. The substrate according to claim 14, wherein
the dielectric includes a plurality of stacked dielectric layers,
the third conductive plate includes a plurality of first flat plate members disposed on front and rear faces of each dielectric, and
the fourth conductive plate includes a plurality of second flat plate members disposed on front and rear faces of each dielectric.

18. The substrate according to claim 17, further comprising:
a first signal wire being placed on a principal surface of a top one of the plurality of dielectrics and being connected to one each end of the n-number of first conductive plate; and
a second signal wire being placed on the principal surface where the first signal wire is placed and being connected to the other each end of the n-number of first conductive plate, wherein
of the plurality of first flat plate members, a flat plate member, which is disposed on the principal surface of the top one, includes first and second flat plate parts disposed on both sides of the first signal wire, and
of the plurality of second flat plate members, a flat plate member, which is disposed on the principal surface of the top one, includes third and fourth flat plate parts disposed on both sides of the second signal wire.

19. The substrate according to claim 14, wherein
the predefined distance is set to relatively large value.

20. The substrate according to claim 14, further comprising:
a first signal wire being placed on the principal surface of dielectric and being connected to one each end of the n-number of first conductive plate; and
a second signal wire being placed on the principal surface where the first signal wire is placed and being connected to the other each end of the n-number of first conductive plate, wherein
the third and fourth conductive plates are placed on the same principal surface as the first and second signal wires.

21. The substrate according to claim 20, wherein
the third conductive plate includes first and second flat plate members disposed on both sides of the first signal wire, and
the fourth conductive plate includes third and fourth flat plate members disposed on both sides of the second signal wire.

* * * * *